US010826480B1

(12) United States Patent
Nguyen et al.

(10) Patent No.: US 10,826,480 B1
(45) Date of Patent: Nov. 3, 2020

(54) GATE DRIVER TO DECREASE EMI WITH SHORTER DEAD-TIME

(71) Applicant: Active-Semi, Inc., Tortola (VG)

(72) Inventors: Thinh Ba Nguyen, Hanoi (VN); Thien Khanh Luong, Hanoi (VN); Thuc Huu Lam, Nghe An Province (VN); Hue Khac Trinh, Hanoi (VN)

(73) Assignee: Active-Semi, Inc., Tortola (VG)

( * ) Notice: Subject to any disclaimer, the term of this patent is extended or adjusted under 35 U.S.C. 154(b) by 0 days.

(21) Appl. No.: 15/640,505

(22) Filed: Jul. 1, 2017

Related U.S. Application Data

(60) Provisional application No. 62/357,739, filed on Jul. 1, 2016.

(51) Int. Cl.
| | | |
|---|---|---|
| *H03K 17/08* | (2006.01) | |
| *H03K 19/0185* | (2006.01) | |
| *H03K 19/0175* | (2006.01) | |
| *H01L 23/525* | (2006.01) | |
| *H02M 1/08* | (2006.01) | |
| *H02M 3/155* | (2006.01) | |

(52) U.S. Cl.
CPC ......... *H03K 17/08* (2013.01); *H03K 19/0185* (2013.01); *H03K 19/017509* (2013.01); *H03K 19/018507* (2013.01); *H01L 23/5256* (2013.01); *H02M 1/08* (2013.01); *H02M 3/155* (2013.01)

(58) Field of Classification Search
CPC ....... H03K 19/017509; H03K 19/0185; H03K 19/01507; H03K 17/08
See application file for complete search history.

(56) References Cited

U.S. PATENT DOCUMENTS

| | | | | |
|---|---|---|---|---|
| 5,781,045 A | * | 7/1998 | Walia | ............... H03K 19/00361 |
| | | | | 326/87 |
| 5,896,059 A | | 4/1999 | McCall et al. | |
| 5,955,914 A | | 9/1999 | Su et al. | |
| 6,107,844 A | * | 8/2000 | Berg | ................... H02M 7/5387 |
| | | | | 327/110 |

(Continued)

OTHER PUBLICATIONS

Notice of Allowance for U.S. Appl. No. 15/466,681, dated Feb. 15, 2018, 8 pages.

(Continued)

*Primary Examiner* — Thomas J. Hiltunen
(74) *Attorney, Agent, or Firm* — Withrow & Terranova, P.L.L.C.

(57) ABSTRACT

An integrated circuit includes a gate driver circuit that controls high side and low side transistors to operate in buck or boost mode. In buck operating mode, after switching off the low side transistor, the gate driver circuit controls the high side transistor in a constant current mode. After the low side transistor is disabled and no longer conducts current, then the gate driver circuit controls the high side transistor to operate in full-enhancement mode. In boost operating mode, after switching off the high side transistor, the gate driver circuit controls the low side transistor in a constant current mode. After the high side transistor is disabled, then the gate driver circuit controls the low side switching transistor to operate in full-enhancement mode. In both buck and boost operation, the gate driver circuit operates without dead time in which both the high side and low side transistors are off.

19 Claims, 17 Drawing Sheets

(56) References Cited

U.S. PATENT DOCUMENTS

| | | | |
|---|---|---|---|
| 6,618,235 B1 | 9/2003 | Wagoner et al. | |
| 6,819,149 B2* | 11/2004 | Shirasawa | H03K 17/162 327/112 |
| 7,141,957 B2* | 11/2006 | Tolle | H02M 1/38 323/284 |
| 7,382,116 B2* | 6/2008 | Endo | G05F 1/618 323/223 |
| 7,450,354 B2 | 11/2008 | Tain et al. | |
| 7,489,166 B2* | 2/2009 | Honda | H03K 17/166 326/82 |
| 7,504,746 B2* | 3/2009 | Wong | H02M 7/53871 307/115 |
| 7,710,187 B2* | 5/2010 | Hiyama | H03K 17/168 326/21 |
| 7,852,060 B2 | 12/2010 | Omet et al. | |
| 7,940,092 B2* | 5/2011 | Zheng | H03K 17/08122 327/110 |
| 8,067,925 B2* | 11/2011 | Grimm | H02M 3/156 323/272 |
| 8,370,659 B2 | 2/2013 | Chiasson et al. | |
| 8,441,265 B2 | 5/2013 | Paulsen et al. | |
| 8,441,306 B2 | 5/2013 | Chen et al. | |
| 8,479,032 B2 | 7/2013 | Trantham et al. | |
| 8,607,076 B2 | 12/2013 | Lester et al. | |
| 9,077,175 B2 | 7/2015 | Su et al. | |
| 9,097,747 B2 | 8/2015 | Ikeda et al. | |
| 9,268,391 B2 | 2/2016 | Cahill-O'Brien et al. | |
| 9,389,263 B2 | 7/2016 | Sartler et al. | |
| 9,461,457 B2* | 10/2016 | Fukuta | H02H 3/08 |
| 9,490,663 B1 | 11/2016 | Kim et al. | |
| 9,561,792 B2 | 2/2017 | Kodawara | |
| 9,583,794 B2 | 2/2017 | Adrian et al. | |
| 9,705,402 B1 | 7/2017 | Carpenter, Jr. et al. | |
| 9,740,258 B2 | 8/2017 | Morning-Smith et al. | |
| 9,946,279 B1 | 4/2018 | Dinh et al. | |
| 10,020,723 B1 | 7/2018 | Carpenter et al. | |
| 10,090,675 B1 | 10/2018 | Lam et al. | |
| 10,110,125 B2* | 10/2018 | Hung | H03K 19/09429 |
| 10,270,239 B2* | 4/2019 | Bahl | H02H 1/0007 |
| 2008/0169791 A1 | 7/2008 | Daio | |
| 2009/0002054 A1* | 1/2009 | Tsunoda | H03K 17/0406 327/374 |
| 2009/0200982 A1 | 8/2009 | Hurtz | |
| 2010/0123485 A1* | 5/2010 | Lee | H03K 17/163 327/109 |
| 2010/0141326 A1* | 6/2010 | Tumminaro | H03K 17/04123 327/374 |
| 2010/0246224 A1 | 9/2010 | Zhang et al. | |
| 2010/0277142 A1 | 11/2010 | Tan et al. | |
| 2012/0049829 A1 | 3/2012 | Murakami | |
| 2012/0056484 A1 | 3/2012 | Mumtaz | |
| 2012/0139500 A1 | 6/2012 | Ye et al. | |
| 2012/0213014 A1 | 8/2012 | Koyashiki et al. | |
| 2013/0038140 A1* | 2/2013 | Seki | H02M 7/53873 307/113 |
| 2013/0038273 A1 | 2/2013 | Riggio et al. | |
| 2013/0038307 A1* | 2/2013 | Saito | H02M 3/335 323/283 |
| 2013/0088203 A1 | 4/2013 | Solie | |
| 2013/0214823 A1* | 8/2013 | Kawamoto | H02H 9/025 327/109 |
| 2013/0221926 A1 | 8/2013 | Furtner | |
| 2015/0042292 A1 | 2/2015 | Mao et al. | |
| 2015/0155783 A1 | 6/2015 | Li et al. | |
| 2015/0263600 A1 | 9/2015 | Bhandarkar et al. | |
| 2015/0303799 A1 | 10/2015 | Tang et al. | |
| 2016/0065072 A1 | 3/2016 | Xiu et al. | |
| 2016/0072403 A1 | 3/2016 | Niwa | |
| 2016/0082946 A1 | 3/2016 | Kodawara | |
| 2016/0105175 A1* | 4/2016 | Ishimatsu | H03K 19/0016 327/109 |
| 2016/0141907 A1 | 5/2016 | Mulawski | |
| 2016/0274172 A1 | 9/2016 | Yoshida | |
| 2016/0307086 A1 | 10/2016 | Nozoe | |
| 2017/0059658 A1 | 3/2017 | Tanaka | |
| 2017/0125995 A1 | 5/2017 | Nisi et al. | |
| 2017/0126973 A1 | 5/2017 | Skeoch | |
| 2017/0163088 A1 | 6/2017 | Toyoda | |
| 2017/0201100 A1 | 7/2017 | Mumtaz | |
| 2017/0324411 A1 | 11/2017 | Gong et al. | |
| 2017/0346335 A1 | 11/2017 | Chen et al. | |
| 2018/0069394 A1 | 3/2018 | Hagen et al. | |
| 2018/0074564 A1 | 3/2018 | Paparrizos et al. | |
| 2018/0275735 A1 | 9/2018 | Katou | |
| 2018/0323699 A1 | 11/2018 | Carpenter, Jr. et al. | |
| 2019/0041938 A1 | 2/2019 | Zupanc et al. | |

OTHER PUBLICATIONS

Non-Final Office Action for U.S. Appl. No. 15/476,977, dated Jan. 12, 2018, 14 pages.
Notice of Allowance and Examiner-Initiated Interview Summary for U.S. Appl. No. 15/476,977, dated May 22, 2018, 12 pages.
Non-Final Office Action for U.S. Appl. No. 16/051,475, dated Feb. 5, 2019, 16 pages.
Final Office Action for U.S. Appl. No. 16/051,475, dated Aug. 19, 2019, 15 pages.
Notice of Allowance and Examiner-Initiated Interview Summary for U.S. Appl. No. 16/051,475, dated Oct. 22, 2019, 9 pages.
Non-Final Office Action for U.S. Appl. No. 15/633,662, dated Apr. 19, 2019, 28 pages.
Final Office Action for U.S. Appl. No. 15/633,662, dated Aug. 22, 2019, 30 pages.
Notice of Allowance for U.S. Appl. No. 15/633,662, dated Nov. 4, 2019, 8 page.
Non-Final Office Action for U.S. Appl. No. 16/030,865, dated Sep. 5, 2019, 15 pages.
Final Office Action for U.S. Appl. No. 16/030,865, dated Nov. 26, 2019, 11 pages.
Advisory Action for U.S. Appl. No. 16/030,865, dated Jan. 29, 2020, 3 pages.
Notice of Allowance for U.S. Appl. No. 16/030,865, dated Feb. 21, 2020, 8 pages.
Notice of Allowance for U.S. Appl. No. 15/633,662, dated Jan. 31, 2020, 9 pages.
Notice of Allowance for U.S. Appl. No. 16/051,475, dated Mar. 2, 2020, 8 pages.
Notice of Allowance for U.S. Appl. No. 15/633,662, dated Apr. 15, 2020, 9 pages.
Notice of Allowance for U.S. Appl. No. 16/051,475, dated Apr. 21, 2020, 8 pages.
Corrected Notice of Allowability for U.S. Appl. No. 15/633,662, dated Aug. 18, 2020, 6 pages.
Notice of Allowance for U.S. Appl. No. 16/931,066, dated Sep. 14, 2020, 8 pages.

* cited by examiner

COMPARE-AND-MASK CIRCUIT

DAC AND COMPARE CIRCUIT

STATE DIAGRAM FOR THE CAPACITOR HEALTH
MONITOR STATE MACHINE

| TSET[3:0] | MILLISECONDS |
|---|---|
| 0000 | 2 |
| 0001 | 4 |
| 0010 | 8 |
| 0011 | 16 |
| 0100 | 32 |
| 0101 | 64 |
| 0110 | 128 |
| 0111 | 256 |
| 1000 | 384 |
| 1001 | 512 |
| 1010 | 640 |
| 1011 | 768 |
| 1100 | 896 |
| 1101 | 1024 |
| 1110 | 1152 |
| 1111 | 1280 |

TSET LOOKUP TABLE

CAPACITOR HEALTH CHECK

SWITCHING CONVERTER CONTROL CIRCUIT

VOLTAGE REFERENCE CIRCUIT

I2C INTERFACE AND DIGITAL REGISTER CONTROL AND DIGITAL STATE MACHINE

CONVENTIONAL GATE DRIVER CIRCUIT

GATE DRIVER CIRCUIT

GATE DRIVER TO DECREASE EMI WITH SHORTER DEAD-TIME

CROSS-REFERENCE TO RELATED APPLICATION

This application claims the benefit under 35 U.S.C. § 119 of provisional application Ser. No. 62/357,739, entitled "Gate Driver To Decrease EMI With Shorter Dead-Time", filed Jul. 1, 2016. The entirety of provisional application Ser. No. 62/357,739 is incorporated herein by reference.

TECHNICAL FIELD

The present disclosure relates generally power loss protection circuits and to related methods.

BACKGROUND INFORMATION

Capacitors and/or batteries are used to store energy in power loss protection systems. FIG. 1 (Prior Art) illustrates one example of a power loss protection system 100 for powering a device. The power loss protection system 100 involves a so-called "eFuse" 101, a switch component 102, enable trip point resistors 103 and 104, a boost converter circuit 105, a bank of capacitors and/or batteries 106, and a voltage regulator 107. This circuitry is soldered onto a printed circuit board. During normal operation of the power loss protection system, when the system is powering the device, the boost converter 105 receives some of the power from the eFuse output and uses that to charge the capacitors and/or batteries 106. If VIN at input 109 is then suddenly lost, for example due to a condition like a power brown out condition or a power cord disconnection event, then the eFuse turns off immediately and the fault signal is asserted. The fault signal is received by the second switch SW2 102. The second switch SW2 102 responds by turning on so that power can then be supplied onto node 108 from the capacitors and/or batteries 106 in the place of the lost power. The linear voltage regulator 107 reduces the capacitor voltage down to the supply voltage "VSYS" required by the device being powered. The required system power and supply voltage VSYS can therefore be maintained for long enough to allow data that is stored in the device in volatile memory to be transferred into non-volatile storage before system power is lost altogether. This kind of prior art power loss protection system is used to power devices where high reliability is required, such as in computers like laptops and servers. If capacitors are used for block 106, then the capacitance of the capacitors must be large enough that the energy stored in the capacitors can sustain system power long enough to allow the device to complete a safe power-off sequence involving backup of configuration information and status after a loss of VIN is detected. The capacitors are sized accordingly to account for anticipated system operation and the needs of the device being powered.

SUMMARY

An integrated circuit includes a switching converter control circuit operable in a buck mode and a boost mode. The switching converter control circuit comprises a gate driver circuit that has a first gate driver output node and second gate driver output node. The gate driver circuit generates a first control signal and supplies the first control signal onto the first gate driver output node. A first terminal of a high side transistor is coupled to the first gate driver output node and receives the first control signal. The gate driver circuit generates a second control signal and supplies the second control signal onto the second gate driver output node. A first terminal of a low side transistor is coupled to the second gate driver output node and receives the second control signal. The high side and low side transistors are used to switch a current through an inductor. In one embodiment, the high side transistor and the low side transistor are parts of the integrated circuit. In another embodiment, the high side transistor and the low side transistor are external to the integrated circuit.

During buck or boost operation of the switching converter control circuit, the high side and low side transistors are switched on and off in complementary fashion. The switching converter control circuit controls the high side and low side transistors such that both transistors are not in full-enhancement mode at the same time. If both transistors were in full-enhancement mode at the same time, then a supply terminal would be shorted to ground. During a first amount of time, a first transistor of the pair of transistors is disabled and a second transistor of the pair of transistors is enabled. At the beginning of a second amount of time, the gate driver circuit controls the second transistor to transition from an enabled state to a disabled state, and the gate driver circuit controls the first transistor to transition from a disabled state to be enabled in a constant current mode. During the second amount of time, the second transistor is transitioning off and the first transistor is controlled in a constant current mode. At the beginning of a third amount of time, the second transistor is fully disabled and no longer conducting current, and the gate driver circuit controls the first transistor to switch from the constant current mode to a full-enhancement mode. During the third amount of time, the second transistor is disabled and the first transistor is enabled. In one embodiment, the first amount of time, second amount of time, and third amount of time occur sequentially without any intervening time period.

When the switching converter control circuit is operating in the buck operating mode, the high side transistor is enabled in the constant current mode when the low side transistor is controlled to switch off at the beginning of the second amount of time. After the low side transistor is disabled and is no longer conducting current, the high side transistor is controlled to operate in full enhancement mode at the beginning of the third amount of time. When the switching converter control circuit is operating in the boost operating mode, the low side transistor is controlled to operate in constant current mode when the high side transistor is switched off at the beginning of the second amount of time. After the high side transistor is disabled and is no longer conducting current, the low side transistor is switched to operate in full-enhancement mode at the beginning of the third amount of time.

In one embodiment, a novel power MOSFET driver involves a high-side and low-side driver transistor pair coupled to drive an inductive load, where there is no switching cycle dead time when both the high-side and the low-side transistors are entirely off, but rather the high-side and low-side transistors are controlled so that there is modest and controlled shoot-through current but the shoot-through current occurs only for an initial short time period during switching. During this initial short time period, the magnitude of the shoot-through current is limited at a safe, fixed and predetermined constant current value. In one example, during switching, when the low-side transistor is to be turned off and the high-side transistor is to be turned on, the magnitude of the shoot-through current during the initial short time period is limited by current limiting current flow through the high-side transistor. After this initial short time period, the high-side transistor is no longer current limited, but rather it is made to operate in full enhancement mode during the remainder of the time that the high-side transistor is to be on. The term "safe" as the term is used here means that neither the high-side transistor nor the low-side transistor is harmed by unsustainably large magnitude shoot-through currents.

The foregoing is a summary and thus contains, by necessity, simplifications, generalizations and omissions of detail; consequently it is appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 2 is a larger diagram formed by FIG. 2A and FIG. 2B.

DETAILED DESCRIPTION

Figure 1:
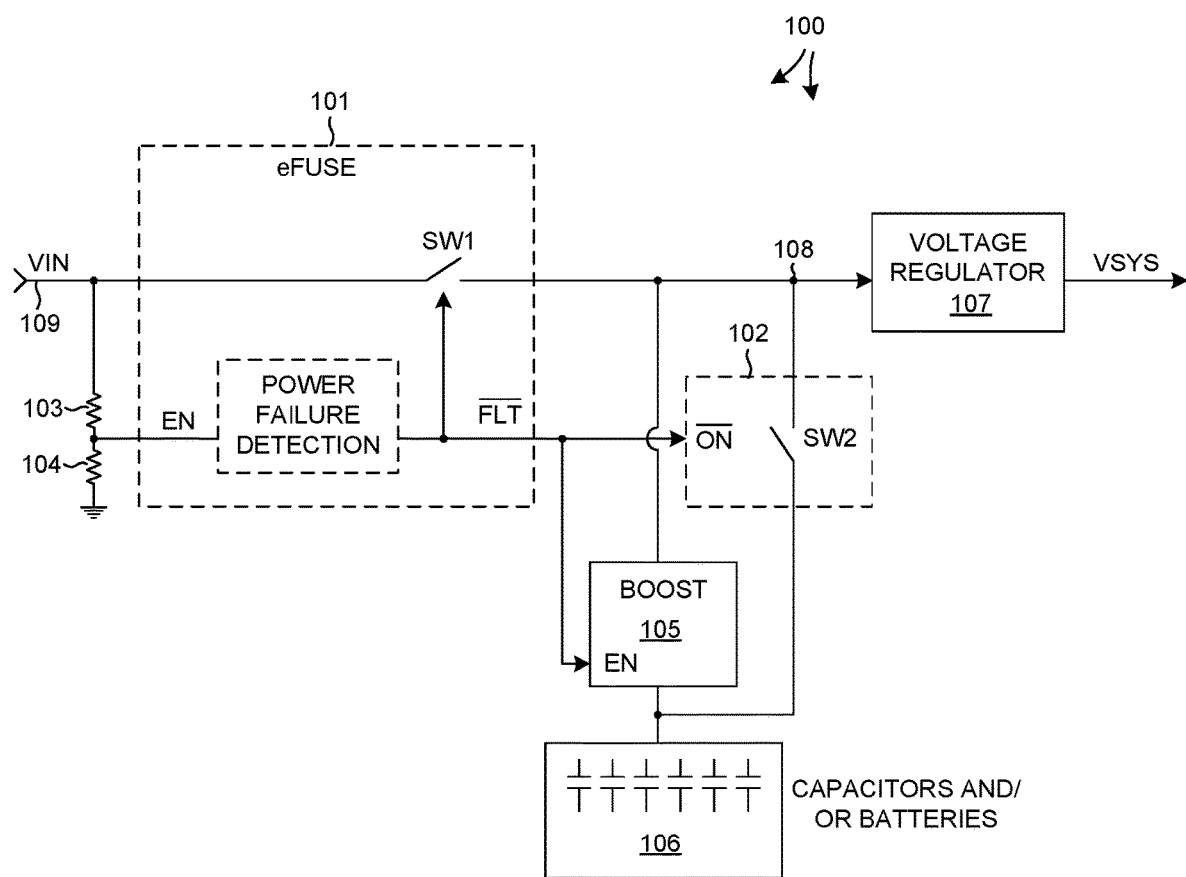
FIG. 1 (Prior Art) is a diagram of an example of a power loss protection system.
Figure 2A:
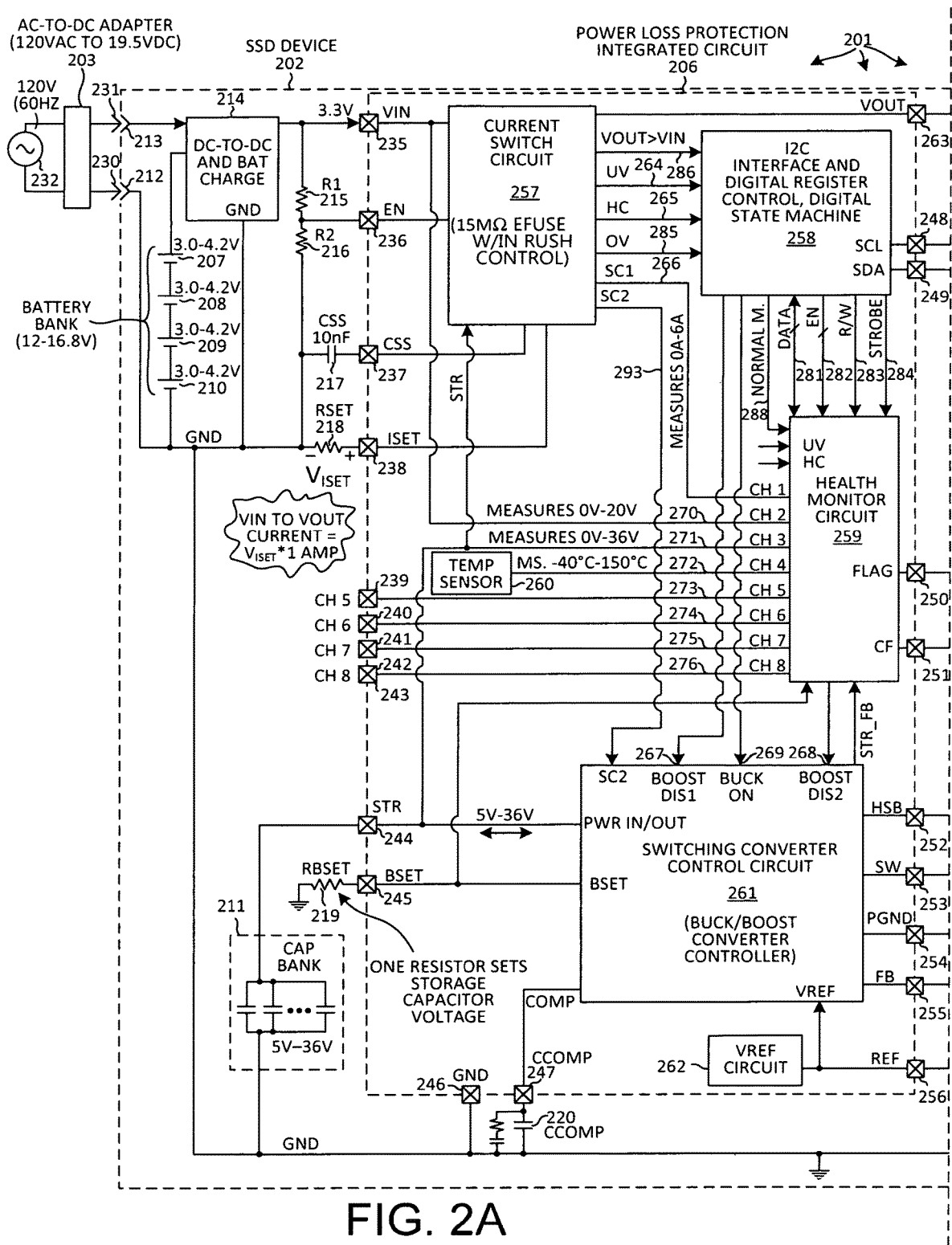
FIG. 2A is a first part of a larger diagram of a system involving a novel power loss protection integrated circuit.
Figure 2B:
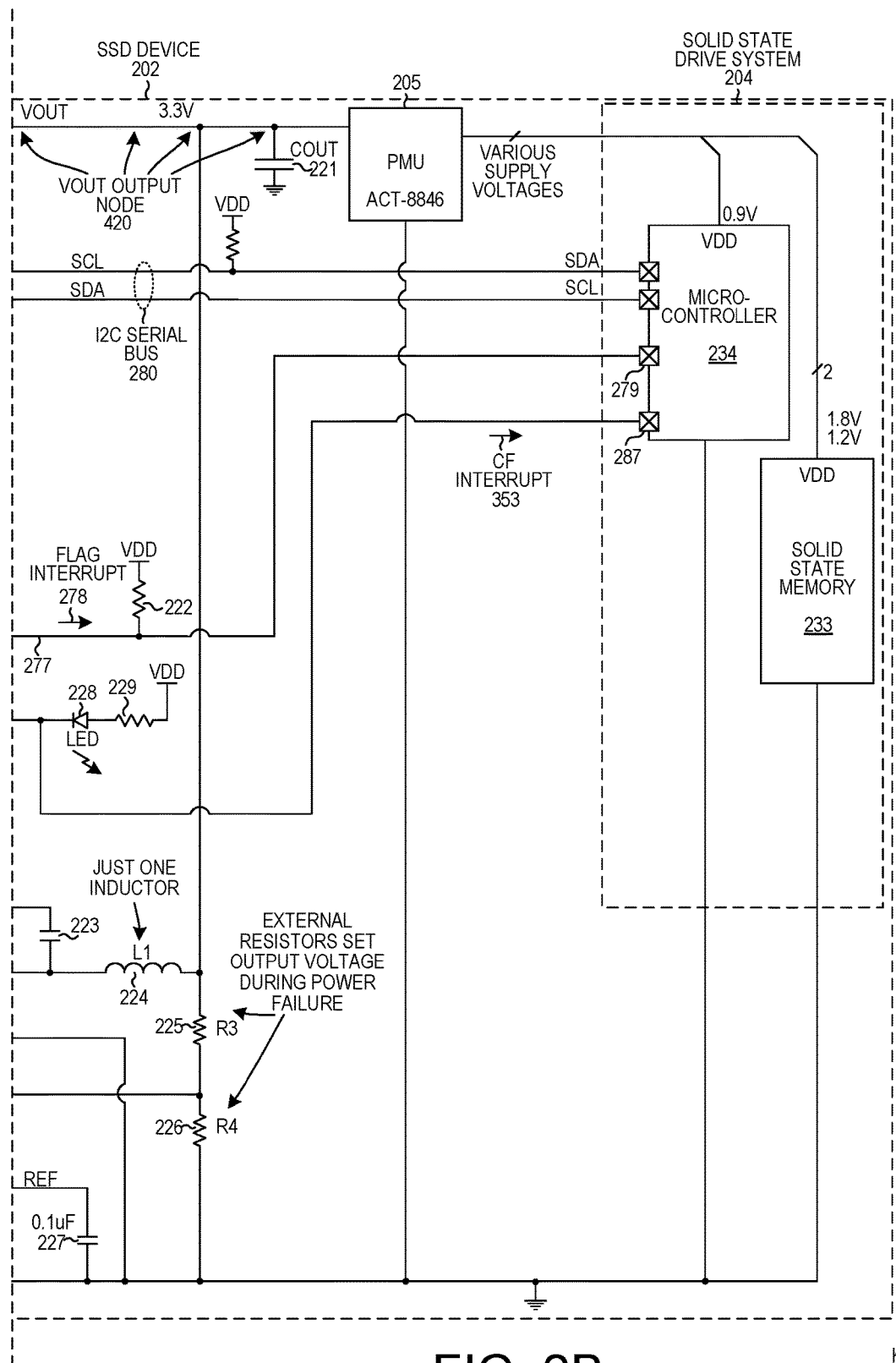
FIG. 2B is a second part of a larger diagram of a system involving a novel power loss protection integrated circuit.

FIG. 2A and FIG. 2B together form a larger diagram, FIG. 2.

FIG. 2 illustrates a system 201 that involves a device to be powered 202, and an AC-to-DC adapter 203. The device 202 in this particular example is a Solid State Drive (SSD) device. It includes a solid state drive system 204, a Power Management Unit (PMU) integrated circuit 205, a power loss protection integrated circuit 206, a bank of series-connected batteries 207-210, a bank of parallel-connected capacitors 211, a socket portion 212 and 213 of a connector, a DC-to-DC converter and battery charger 214, and other discrete components 215-229. The solid state drive system 204 includes, among other components not shown, a solid state memory portion 233 and a microcontroller integrated circuit 234. The AC-to-DC adapter 203 can be connected to the SSD device 202 by plugging its plug portion 230 and 231 into the socket portion 212 and 213 of the SSD device, and the AC-to-DC adapter 203 can be disconnected from the SSD device 202 by unplugging it from the socket portion. The AC-to-DC adapter 203 is coupled to receive power from a 120 volt RMS VAC 60 Hz supply voltage source 232 such as, for example, a standard residential wall socket. The SSD device 202 further includes a printed circuit board (not shown) disposed within an enclosure (not shown). The integrated circuits and other components of the SSD device 202 are mounted to the PCB and are contained in the enclosure.

Power loss protection integrated circuit 206 includes a VIN terminal 235, an EN terminal 236, a CSS terminal 237, an ISET terminal 238, several analog input terminals 239-243, a STR terminal 244, a voltage set input terminal BSET 245, a ground terminal GND 246, a CCOMP terminal 247, a VOUT terminal 263, an SCL terminal 248, a SDA terminal 249, a flag output terminal 250, a capacitor flat terminal CF 251, an HSB terminal 252, a SW terminal 253, a PGND terminal 254, an FB terminal 255, a REF terminal 256, a current switch circuit 257, an I2C interface and digital register control and digital state machine circuit 258, a health monitor circuit 259, an on-chip temperature sensor 260, a buck/boost switching converter control circuit 261, and a reference voltage circuit 262. The "terminals" mentioned above are integrated circuit terminals such as either bond pads of an integrated circuit chip or package terminals of an integrated circuit package that houses the actual integrated circuit chip.

The current switch circuit 257 is also called an eFuse circuit. The current switch circuit 257 can couple the VIN terminal 235 to the VOUT terminal 263 such that current can freely flow from the VIN terminal 235, through the current switch circuit 257, to the VOUT terminal 263, to VOUT output node 420, and to the load. When the current switch circuit 257 is ON in this way, it only introduces a 15 milliohm resistance in that current path. The current switch circuit 257 monitors the voltage on the VIN terminal. If the voltage on the VOUT terminal 263 is greater than the voltage on the VIN terminal 235, then the switch circuit 257 asserts the VOUT>VIN digital signal on conductor 286 to a digital logic high, otherwise the VOUT>VIN digital signal is a digital logic low. If the voltage on the VIN terminal is below an undervoltage value set by resistors 215 and 216, then the current switch circuit 257 is OFF such that the VIN terminal is not coupled to the VOUT terminal through the switch circuit 257. If the current switch circuit 257 detects the "UV" undervoltage condition, then it asserts the UV digital signal on conductor 264 to a digital logic high, otherwise the UV digital signal is a digital logic low. If the voltage on the VIN terminal is above a programmable overvoltage value, then the current switch circuit 257 is OFF such that the VIN terminal is not coupled to the VOUT terminal through the switch circuit 257. If the current switch 257 detects the "OV" overvoltage condition, then it asserts the OV digital signal on the OV conductor 285.

In addition to sensing voltages, the current switch circuit 257 also senses the magnitude of current flowing through the current switch between the VIN terminal and the VOUT terminal. If the current is below a predetermined high current value ($A_{HC}$), and if the current switch 257 is to be ON as determined by the voltage on the VIN terminal, then the current switch is fully ON (to have a resistance of 15 milliohms or less). If, however, the current is detected to reach the high current value ($A_{HC}$), then the current switch circuit begins to regulate the through-current so that the through-current remains at the high current value amount $A_{HC}$ but does not exceed $A_{HC}$. The current switch 257 does this by controlling the gate voltages on a pair of series field effect transistors through which the through-current flows. Increasing the drain-to-source resistance $R_{DS}$ of these field effect transistors allows the flow of current to be maintained at the $A_{HC}$ amount. If, however, the $R_{DS}$ across the transistors becomes too high, or if the voltage on the VOUT terminal decreases too much, then the field effect transistors are not linearly regulated by controlling their $R_{DS}$ resistances, but rather the field effect transistors are turned on and off repeatedly with a duty cycle. The duty cycle is regulated in an attempt to limit the power dropped in the current switch circuit 257. In this way, the current switch circuit 257 serves a function of limiting the magnitude of a possible large inrush current (inrush power) that might otherwise flow into the system when the SSD device is initially plugged into the AC-to-DC adapter 203 when the storage capacitors 211 are fully discharged and when the COUT capacitor 221 is fully discharged. In the present example, the inrush current limit set by the resistance of resistor RSET 218 is a current (for example, two amperes) that is larger than a typical digital logic or analog signaling input terminal or output terminal could handle.

The CSS capacitor 217 slows down the start up slew rate of the current switch circuit 257, thereby providing a "soft start" operation. The board designer can select the capacitance value of the CSS capacitor to tailor the startup slew rate as desired. If left open, the startup slew rate defaults to one millivolt per microsecond. The high current value ($A_{HS}$) is set by setting the resistance value of resistor RSET 218. The high current value $A_{HC}$ is roughly equal to one volt divided by the RSET value in ohms. If the current switch circuit 257 detects the "HC" high current condition, then it asserts the HC digital signal on conductor 265 to digital logic high, otherwise the HC digital signal is a digital logic low. The current switch circuit 257 includes a current sensor/mirror circuit 353 that provides a small auxiliary current flow whose magnitude is proportional to the magnitude of the main current flow through the current switch circuit 257 from the VIN terminal to the VOUT terminal. This small mirrored auxiliary current is converted into a voltage signal by making the current flow across the RSET resistor 218. The resulting voltage signal, whose magnitude is proportional to the current flow through the switch circuit 257, is output from the current switch circuit 257 via the switch current (SC1) conductor 266. The voltage signal SC1 on the switch current SC1 conductor 266 is indicative of the magnitude of the current flowing through the current switch 257. For additional information on the structure and operation of current sense/mirror circuit 353, see U.S. patent application Ser. No. 15/476,977 entitled "Fast Settlement Of Supplement Converter For Power Loss Protection System," by Lam et al. filed on Apr. 1, 2017, now U.S. Pat. No. 10,090,675. The entire subject matter of U.S. patent application Ser. No. 15/476,977 is hereby incorporated by reference.

In addition to voltage signal SC1, the current switch circuit 257 also outputs another signal (SC2). Signal SC2 is a current that is proportional to the current flowing through the current switch 257 from the VIN terminal to the VOUT terminal. This current signal SC2 is communicated via conductor 293 to the switching converter control circuit 261. In the switching converter control circuit 261, the current SC2 is converted into a voltage signal by running the current through a resistor 402.

The buck/boost switching converter control circuit 261, together with external components 220, 221 and 223-227 is operable as a buck switching converter or as a boost switching converter. When it is operating in a boost mode, the converter receives a relatively low voltage from the VOUT terminal, and outputs a boosted up relatively high voltage onto the STR terminal 244. In one example, the voltage on the VOUT terminal is 3.3 volts DC, and the voltage that the converter drives onto the STR terminal 244 is 36 volts DC. This relatively high voltage serves to charge the capacitor bank 211 capacitors up to 36 volts. The magnitude of this charging voltage is set by the value of the RBSET resistor 219. When the converter is operating in a buck mode, the converter receives a relatively high voltage from the STR terminal 244, and outputs a bucked down relatively low voltage onto the VOUT terminal 263. In one example, the voltage on the STR terminal 244 is 36 volts (as set by the RBSET resistor), and the voltage that the converter drives onto the VOUT terminal is 3.3 volts DC. The buck/boost switching converter control circuit 261 has an active high boost disable digital signal input lead BOOST_DIS1 267 and another active high boost disable digital input lead BOOST_DIS2 268. If a digital logic high signal is present on either of these inputs, then the converter is prevented (disabled) from operating in the boost mode. The buck/boost switching converter control circuit 261 also has an active high digital signal input lead BUCK ON 269. If a digital logic high signal is present on this input 269, then the converter is made to start operating in the buck mode.

The health monitor circuit 259 includes an eight-channel sigma-delta Analog-to-Digital Converter (ADC), a set of compare-and-mask circuits, and a digital state machine. The health monitor circuit 259 autonomously monitors the voltages on eight input conductors 266 and 270-276 (8 channels). If any one of these voltages is detected to be below a corresponding lower voltage limit or is detected to be above a corresponding upper voltage limit, then this undervoltage or overvoltage condition is latched into a latch of the detecting compare-and-mask circuit, and the voltage on flag terminal 250 is pulled down to ground potential. The voltage on the open-drain flag terminal 250 is otherwise not pulled down, but rather is pulled up to the VDD supply voltage by external pullup resistor 222. The low voltage (ground potential) on flag terminal 250 and conductor 277 constitutes an interrupt signal 278. This active low interrupt signal 278 is supplied via conductor 277 onto the active low interrupt input terminal 279 of microcontroller 234. The low interrupt signal therefore interrupts the microcontroller 234. The microcontroller 234 can respond to the interrupt, as further explained below, by accessing the power loss protection integrated circuit 206 via the two-wire I2C bus 280. The two conductors SDL and SDA are the two conductors of the I2C bus. The values of the lower voltage limit and the upper voltage limit for each of the eight channels is user programmable (changeable via the microcontroller 234 under software control) via the I2C interface of terminals 248 and 249. In the present example, the measurable voltage range on conductor 266 corresponds to a measured through-current flowing through the current switch 257 in the range of from zero amperes to six amperes. In the present example, the measurable voltage range on conductor 270 corresponds to a measured voltage on the VIN terminal in the range of from zero volts to twenty volts. In the present example, the measurable voltage range on conductor 271 corresponds to a measured storage capacitor voltage on the STR terminal in the range of from zero volts to thirty-six volts. In the present example, the measurable voltage range on conductor 272 corresponds to a measured on-chip temperature in the range of from minus forty degrees Celsius to plus one hundred and fifty degrees Celsius.

The health monitor circuit 259 also includes a capacitor health check circuit 299. The capacitor health check circuit 299 includes a digital state machine. If the power loss protection integrated circuit 206 is not operating in the normal mode as indicated by the active high NORMAL_MODE digital signal on conductor 288, then the capacitor health check circuit is disabled. If, however, the power loss protection integrated circuit 206 has been operating in the normal mode for a least four minutes, at the conclusion of the four minute period the state machine disables the boost converter and enables a ten milliampere current source 350. The ten milliampere current source 350 sinks current from the STR terminal 244. At the end of a time period determined by the programmable value TSET[3:0], the state machine disables the ten milliampere current source 350 and enables a fifty milliampere current source 351 that sinks current from the STR terminal 244. The fifty milliampere current source remains enabled for a period of time determined by the value TSET[3:0]. In one example, this time period is one tenth the period of time the ten milliampere current source was enabled. If at any time during the period of time when either of the two sinking current sources is enabled the voltage on the STR terminal 244 falls below a programmable voltage, then a latch 352 is set. The programmable voltage is determined by the user programmable value THR[3:0]. The setting of the latch causes the voltage on the capacitor fault terminal CF 251 to be pulled down to ground potential. This is an indication of a capacitor fault condition. This active low fault signal 353 may, for example, be supplied onto a second interrupt input terminal 287. In addition, the LED 228 is on during the time when then capacitor fault signal is asserted low.

The I2C interface and digital register control and digital state machine circuit 258 is a digital block that includes an I2C serial bus interface circuit and a digital state machine circuit. There are various digital registers disposed in various places across the integrated circuit. The digital outputs of various ones of the bits of these registers are coupled to various circuits in the integrated circuit so that the stored digital values will control and affect operation of the circuitry. Other selected bits of the registers are used to capture the digital states of corresponding nodes in the circuitry. The I2C interface is usable to read and to write to any selected one of these registers via the DATA conductors 281, the enable conductors 282, the R/W conductor 283 and the strobe conductor 284. The DATA conductors 281, the R/W conductor 283, and the strobe conductor 284 extend to all these registers. For each register, there is one dedicated enable conductor that extends from the I2C interface logic to an enable input lead of that register.

To write an 8-bit value into a particular register, the I2C interface places the data to be written onto the DATA conductors 281. Because the access is a write, the voltage on the R/W conductor 282 is driven to a digital logic low level. The enable conductors to all the registers are driven to be disabled (digital logic low), except for the one desired register that is to be written. The enable conductor to that register is driven with a digital logic high signal. After these signals are set up, the strobe signal on conductor 284 is pulsed high to clock the data into the enabled register. The 8-bit value stored in a particular register can be read by the I2C interface in similar fashion except that the I2C interface does not drive data out on the DATA conductors, but rather the I2C is setup to read in data from the DATA conductors. In addition, the digital logic value driven onto the R/W conductor is a digital logic high value. When the data bus conductors are set up this way, a pulsing of the strobe signal causes the enabled register to output its 8-bit value onto the 8-bit DATA bus, so that the 8-bit value will then be latched into the I2C interface logic. In this way, the I2C interface can read from, and can write to, any selected one of the registers on the integrated circuit.

Figure 3:
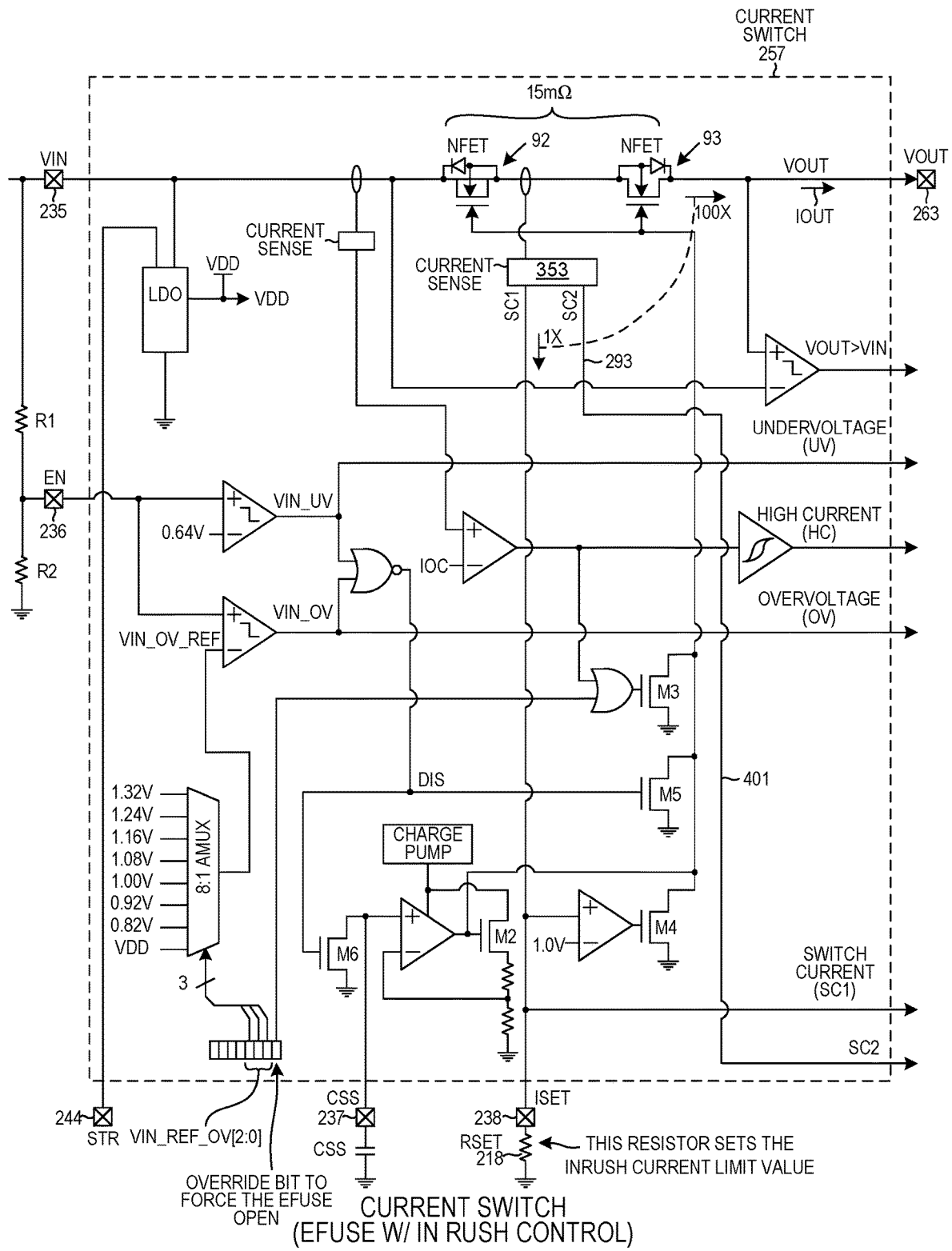
FIG. 3 is a more detailed diagram of the current switch circuit 257 of FIG. 2.

FIG. 3 is a more detailed diagram of the current switch circuit 257 of FIG. 2.

Figure 4:
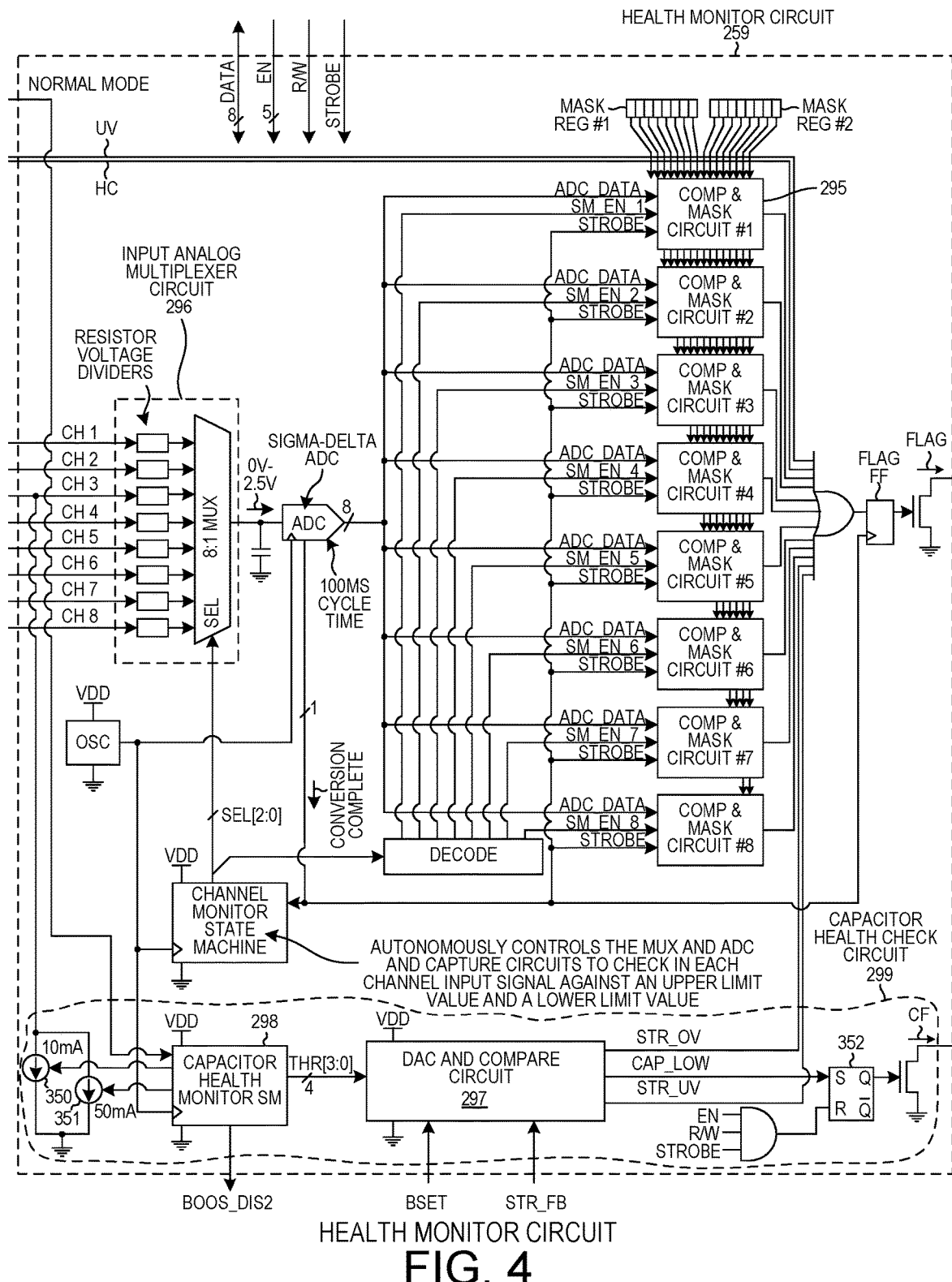
FIG. 4 is a more detailed diagram of the health monitor circuit 259 of FIG. 2.

FIG. 4 is a more detailed diagram of the health monitor circuit 259 of FIG. 2.

Figure 5:
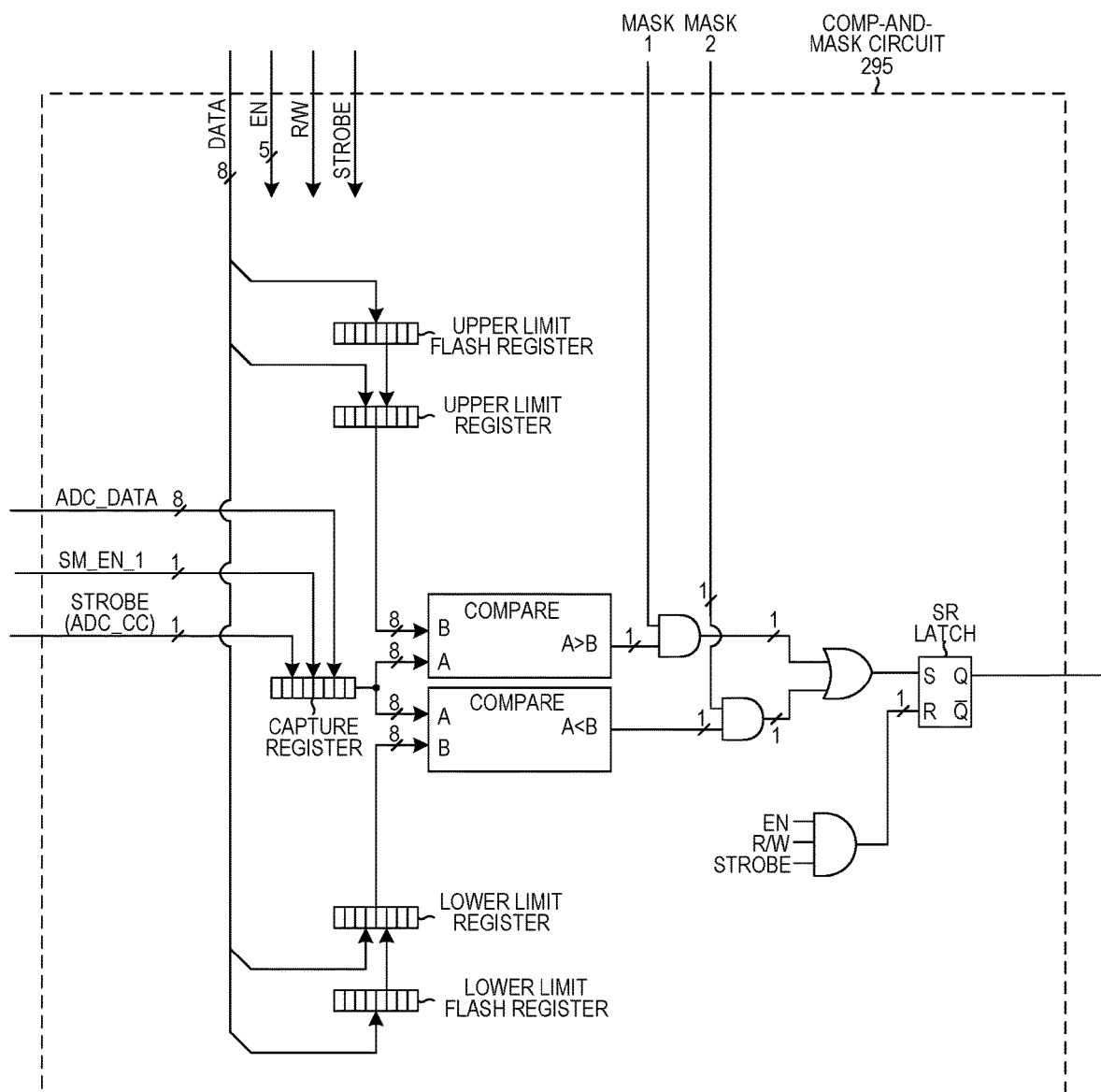
FIG. 5 is a more detailed diagram of one of the compare-and-mask circuits of FIG. 4.

FIG. 5 is a more detailed diagram of one of the compare-and-mask circuits 295 of FIG. 4.

Figure 6:
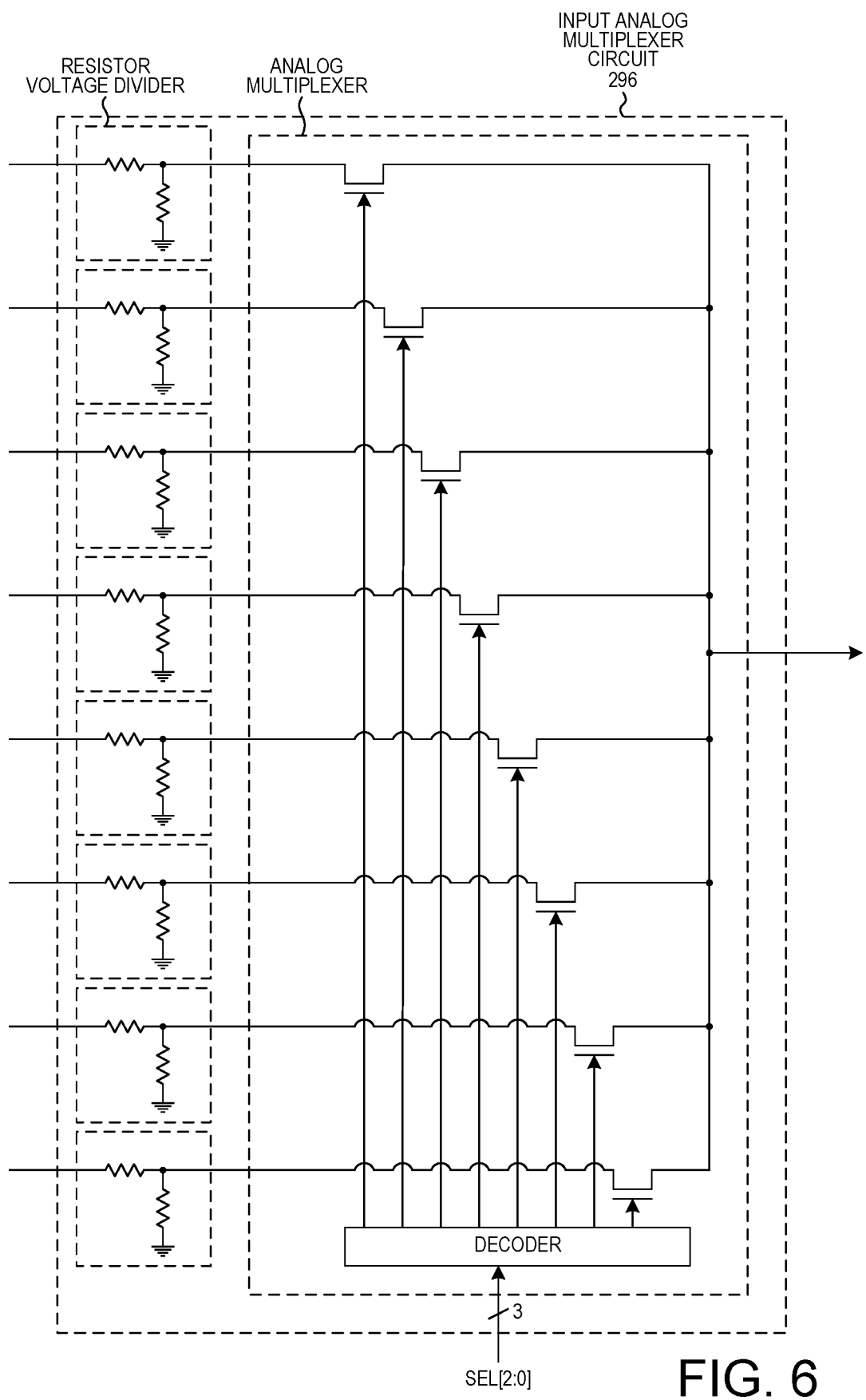
FIG. 6 is a more detailed diagram of the input analog multiplexer circuit of FIG. 4.

FIG. 6 is a more detailed diagram of the input analog multiplexer circuit 296 of FIG. 4.

Figure 7:
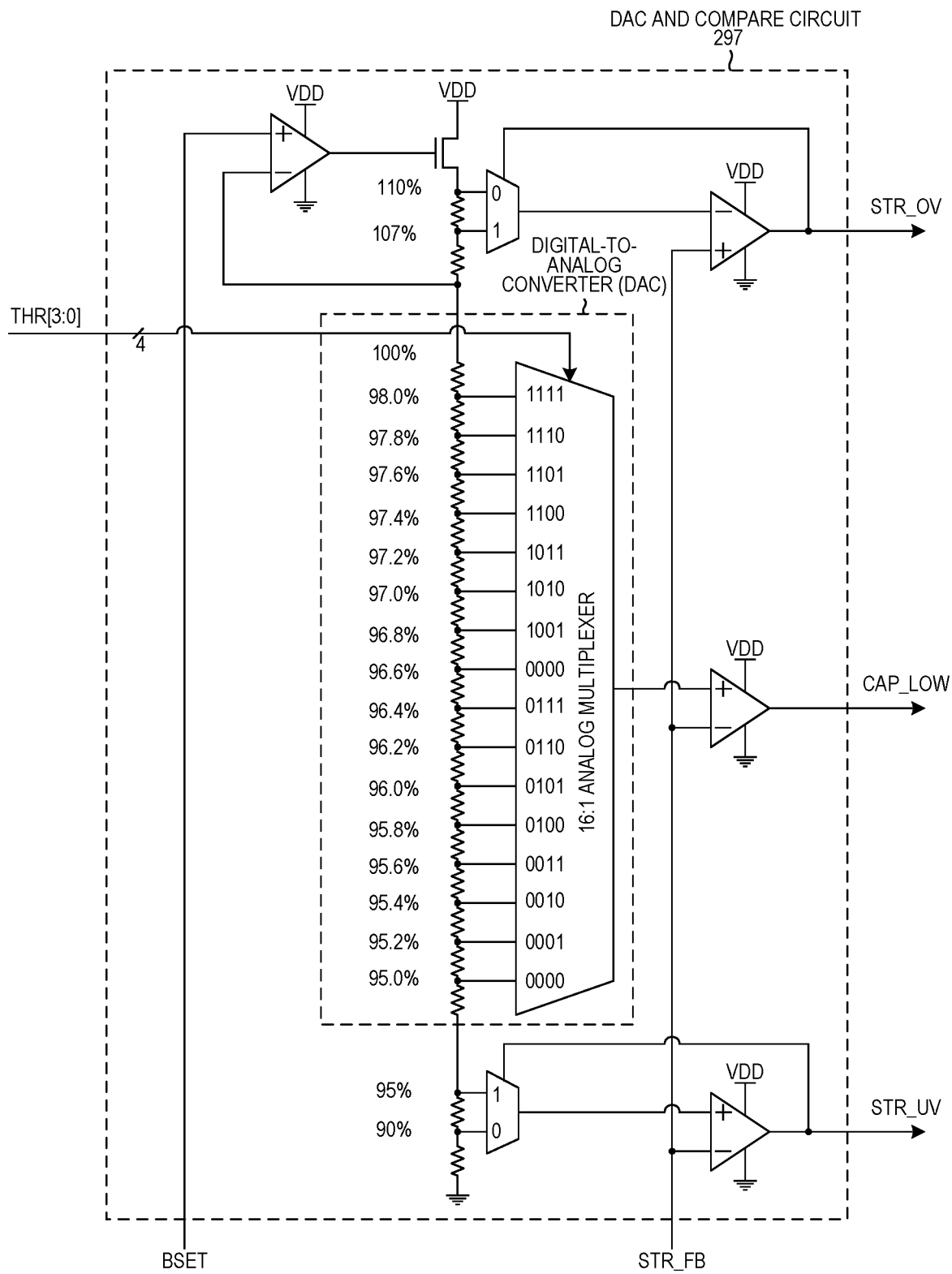
FIG. 7 is a more detailed diagram of the DAC and compare circuit of FIG. 4.

FIG. 7 is a more detailed diagram of the DAC and compare circuit 297 of FIG. 4.

Figure 8:
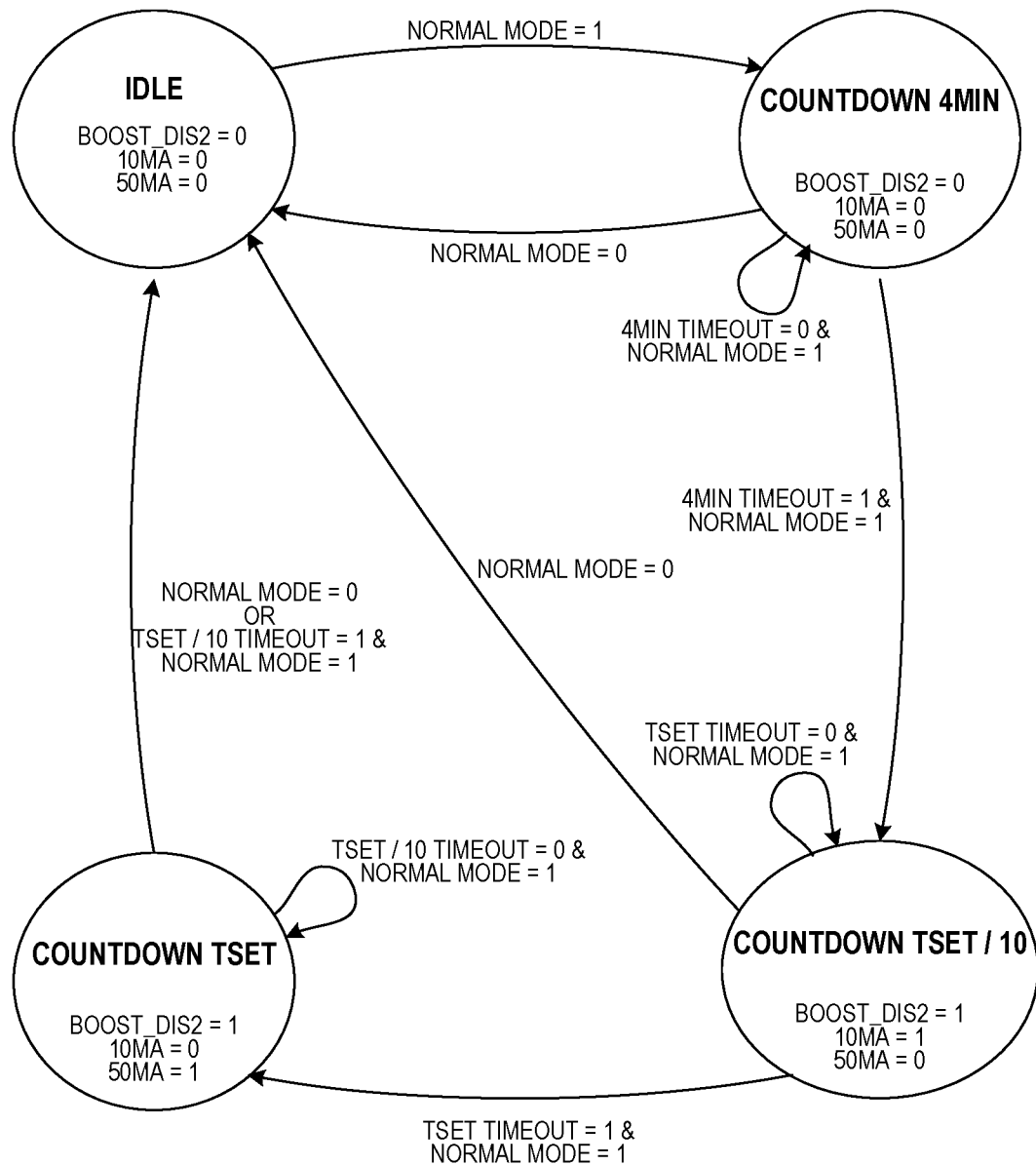
FIG. 8 is a state diagram that sets forth the operation of the capacitor health monitor state machine of the capacitor health check circuit.

FIG. 8 is a state diagram that sets forth the operation of the capacitor health monitor state machine 298 of the capacitor health check circuit 299 of the health monitor circuit 259 of FIG. 4.

Figures 9, 10:
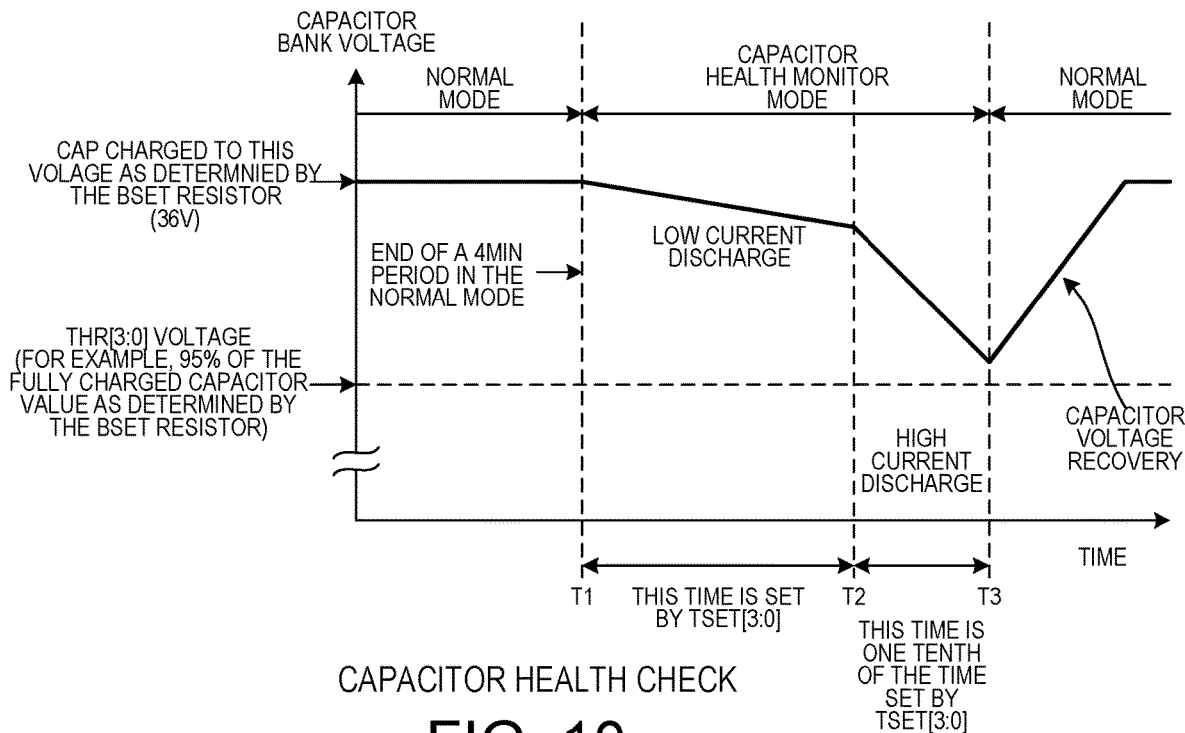
FIG. 9 is a table that indicates, for each 4-bit TSET[3:0] value, the corresponding time period throughout which the ten milliampere current sink is enabled.
FIG. 10 is a diagram that illustrates one capacitor health check operation as carried out by the capacitor health check circuit.

FIG. 9 is a table that indicates, for each 4-bit TSET[3:0] value, the corresponding time period throughout which the ten milliampere current sink is enabled.

FIG. 10 is a diagram that illustrates one capacitor health check operation as carried out by the capacitor health check circuit 299.

Figure 11:
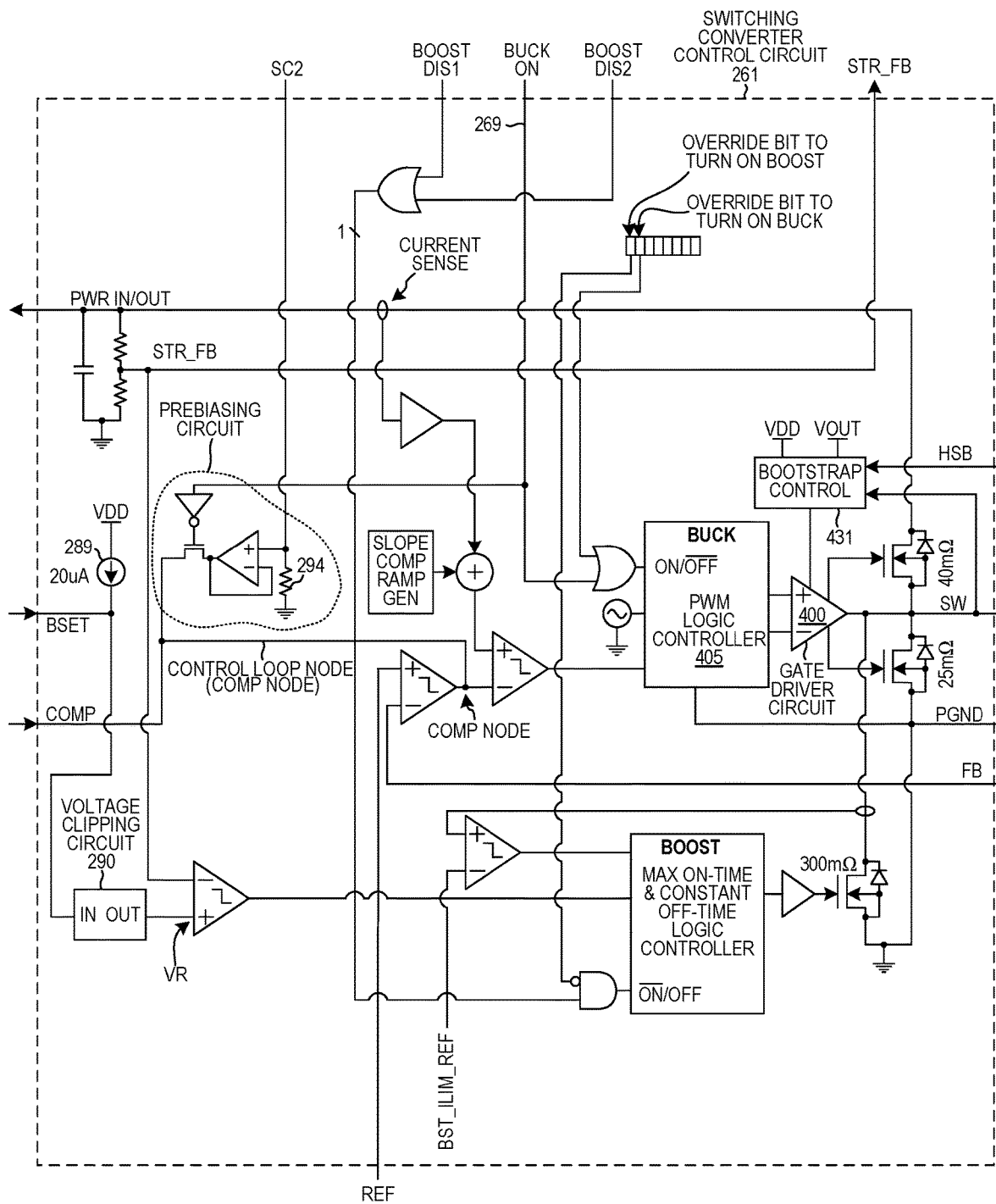
FIG. 11 is a diagram of the switching converter control circuit 261 of FIG. 2.

FIG. 11 is a diagram of the switching converter control circuit 261 of FIG. 2.

Figure 12:
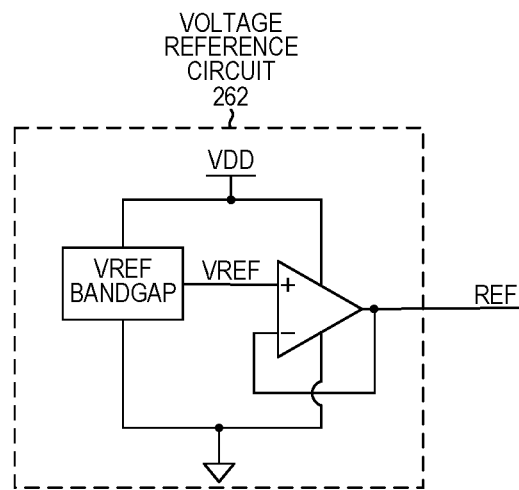
FIG. 12 is a more detailed diagram of the voltage reference circuit 262 of FIG. 2.

FIG. 12 is a more detailed diagram of the voltage reference circuit 262 of FIG. 2.

Figure 13:
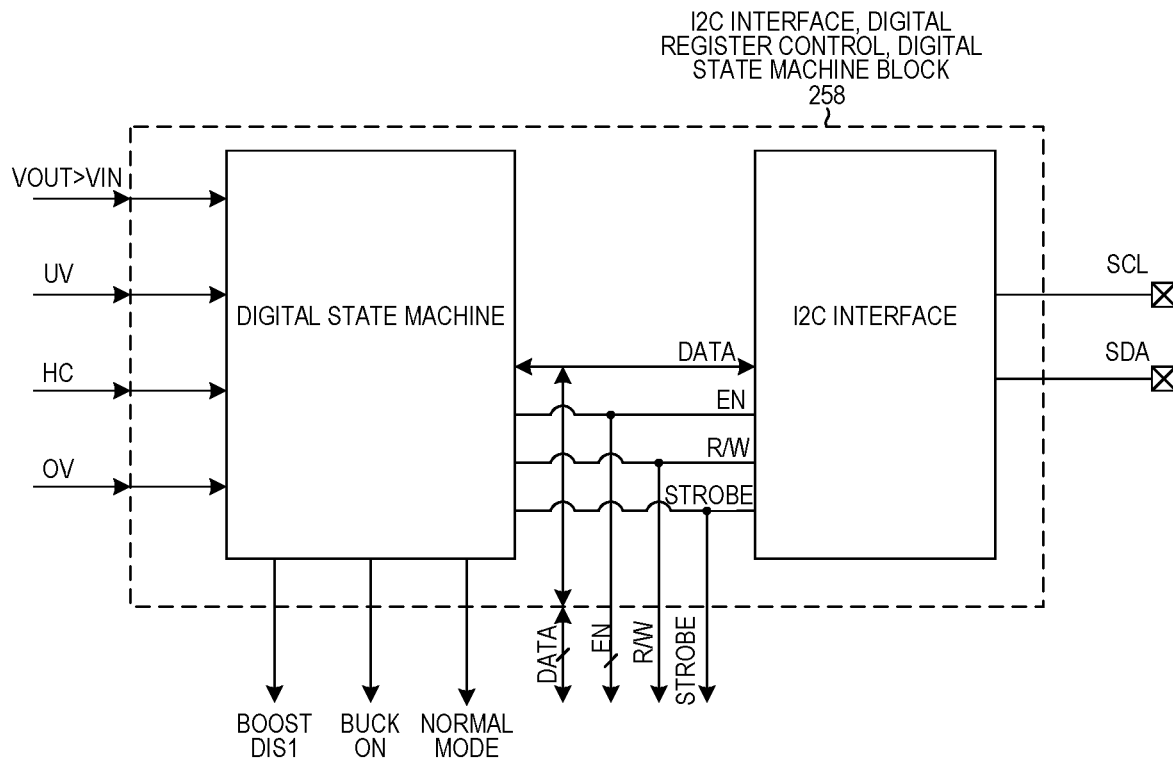
FIG. 13 is a block diagram of the I2C interface and digital register control and digital state machine circuit 258 of FIG. 2.

FIG. 13 is a block diagram of the I2C interface and digital register control and digital state machine circuit 258 of FIG. 2.

The magnitude of the relatively high voltage to which the converter boosts in the boost mode is user programmable, and is set by providing only one external resistor RBSET 219 of the appropriate resistance. Provided that the voltage on the voltage set input terminal BSET 245 is not below a first predetermined voltage V1 and is not above a second predetermined voltage V2, the magnitude of the resistance of this one RBSET resistor 219 corresponds directly to the magnitude of the relatively high voltage to which the STR terminal 244 is driven in the boost mode. The relatively high voltage to which the STR terminal 244 is driven in the boost mode is a gained-up version of the voltage on the BSET terminal 245. The voltage on the BSET terminal 245 is equal to the resistance of the RBSET resistor 219 multiplied by the twenty microampere current supplied by internal current source 289 of FIG. 11. Block 290 in FIG. 11 is a voltage clipping circuit. For additional information on the structure and operation of voltage clipping circuit 290, see U.S. patent application Ser. No. 15/466,681 entitled "Programmable Voltage Setting With Open And Short Circuit Protection," by Dinh et al. filed on Mar. 22, 2017, now U.S. Pat. No. 9,946,279. The entire subject matter of U.S. patent application Ser. No. 15/466,681 is hereby incorporated by reference.

Figure 14:
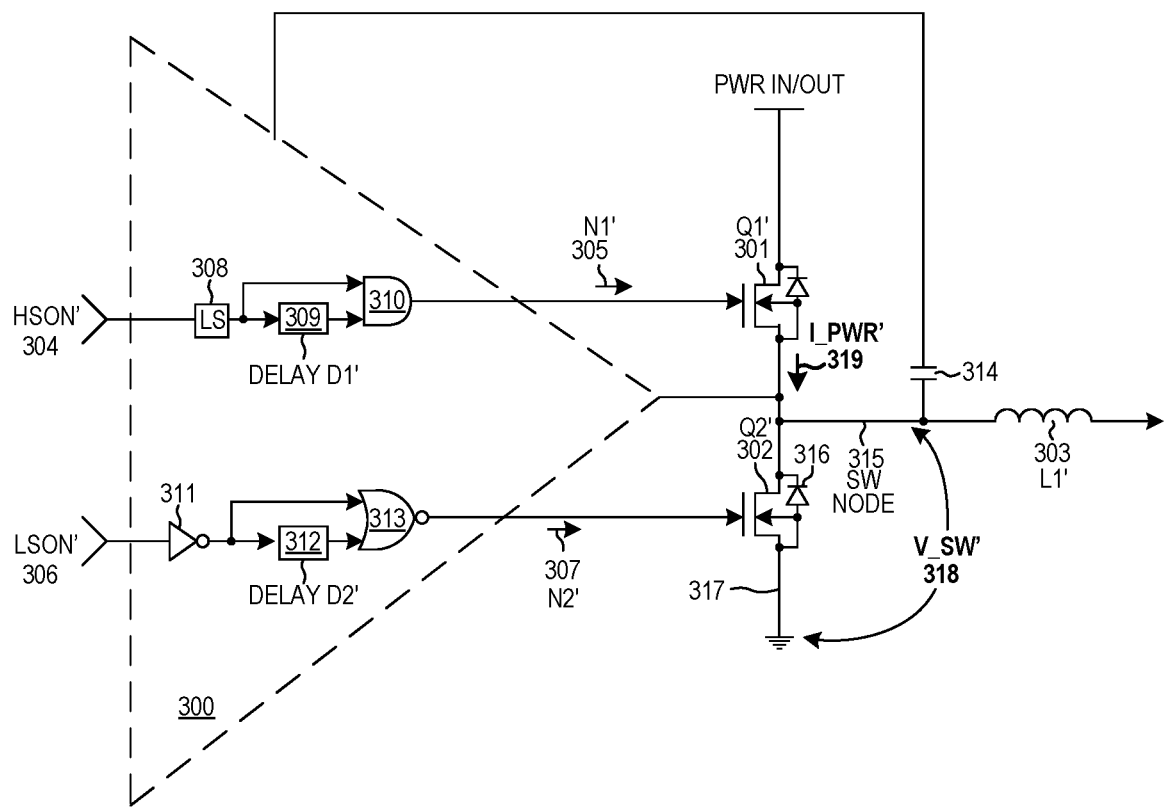
FIG. 14 is a circuit diagram of a conventional gate driver circuit 300.

FIG. 14 is a circuit diagram of a conventional gate driver circuit 300. The conventional gate driver circuit 300 is described to illustrate the advantages of novel gate driver circuit 400 shown in FIG. 11. The conventional gate driver circuit 300 controls high side transistor Q1' 301 and low side transistor Q2' 302 to switch a current through inductor L1' 303. The conventional gate driver circuit 300 receives a high side control signal HSON' 304 and, in turn, generates and supplies a control signal N1' 305 onto a gate of high side transistor Q1' 301. The conventional gate driver circuit 300 receives a low side control signal LSON' 306 and, in turn, generates and supplies a control signal N2' 307 onto a gate of low side transistor Q2' 302. The conventional gate driver circuit 300 comprises a level shift circuit 308, a time delay circuit 309, and an AND gate 310. The conventional gate driver circuit 300 comprises a level shift circuit 311, a time delay circuit 312, and an NOR gate 313. A capacitor 314 is coupled between a switch node 315 and a terminal of the conventional gate driver circuit 300.

During operation of the conventional gate driver circuit 300, the conventional gate driver circuit 300 switches the low side transistor Q2' 302 from an enabled state to a disabled state and switches the high side transistor Q1' 301 from a disabled state to an enabled state. Before turning on the high side transistor Q1' 301 and switching off the low side transistor Q2' 302, the conventional gate driver circuit 300 controls both high side transistor Q1' 301 and low side transistor Q2' 302 to switch off. The period of time both high side transistor Q1' 301 and low side transistor Q2' 302 are disabled is referred to as dead time. After the dead time period where both the high side transistor Q1' 301 and low side transistor Q2' 302 are off, the high side transistor Q1' 301 is switched on. Upon switching on the high side transistor Q1' 301, an amount of current flows from the the high side transistor Q1' 301 through body diode 316 of the low side transistor Q2' 302 to ground node 317 resulting in a current spike. The current that flows from the high side transistor Q1' 301 through the body diode 316 of the low side transistor Q2' 302 is also referred to as body diode reverse recovery current. The body diode reverse recovery current is one cause of inefficiencies associated with the conventional gate driver circuit 300. Minimizing dead time is typically desirable.

Figure 15:
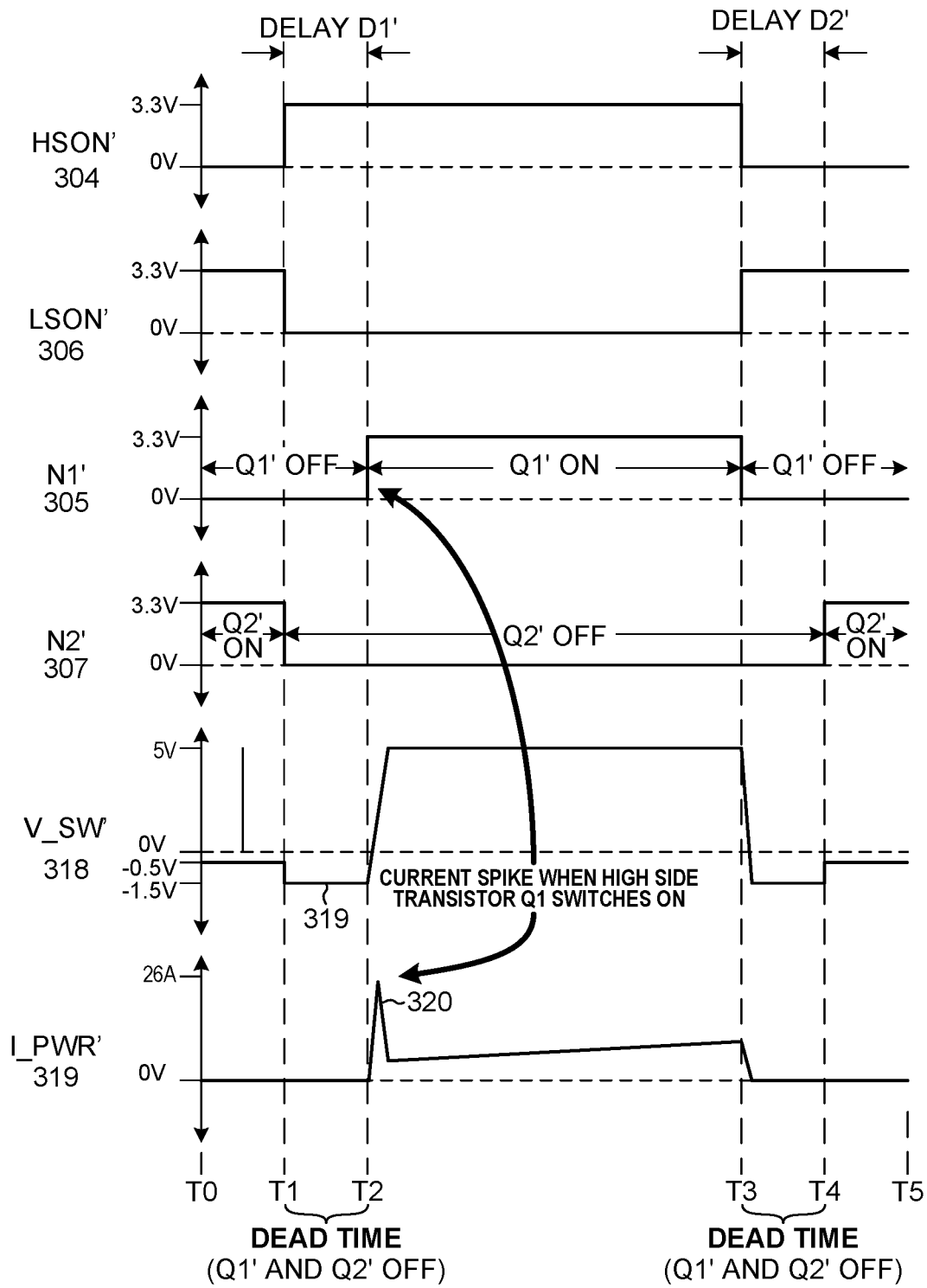
FIG. 15 is a waveform diagram of signals of the conventional gate driver circuit 300 during operation.

FIG. 15 is a waveform diagram of signals of the conventional gate driver circuit 300 during operation. Between T0 and T1, low side transistor Q2' 302 is enabled and high side transistor Q1' 301 is disabled. At T1, the control signal HSON' 304 transitions from a digital logic low level to a digital logic high level and the control signal LSON' 306 transitions from a digital logic high level to a digital logic low level. N2' 307 transitions from a digital logic high level to a digital logic low level causing the low side transistor Q2' 302 to switch off. Prior to switching on the high side transistor Q1' 301, the conventional gate driver circuit 300 controls the high side transistor Q1' 301 and the low side transistor Q2' 302 to remain off for an amount of time. Between T1 and T2, both high side transistor Q1' 301 and low side transistor Q2' 302 are disabled. The time between T1 and T2 is also referred to as deadtime because both transistors are off. At T2, N1' 305 transitions from a digital logic low level to a digital logic high level causing the high side transistor Q1' 301 to switch on. Between T2 and T3, the high side transistor Q1' 301 operates in full-enhancement mode. At T3, the next switching cycle occurs. HSON' 304 transitions from a digital logic high level to a digital logic low level and N1' 305 transitions from a digital logic high level to a digital logic low level causing the high side transistor Q1' 301 to be disabled. LSON' 306 transitions from a digital logic low level to a digital logic high level. Both high side transistor Q1' 301 and low side transistor Q2' 302 remain off during deadtime period between T3 and T4. At T5, N2' 307 transitions from a digital logic low level to a digital logic high level causing low side transistor Q2' 302 to switch on.

As shown in the waveform diagram for V_SW' 318, during the deadtime periods T1 to T2 and T3 to T4, the voltage on the switch node 315 drops from approximately −0.5 volts to approximately −1.5 volts. A reverse recovery current spike is shown in the waveform diagram I_PWR' 319. At time T2, a body diode reverse recovery current flows through body diode 316 and to the ground node 317 at time T2 when the the high side transistor Q1' 301 is switched on. The decrease in voltage on the switch node 15 and reverse recovery current spike result in generally inefficient operation.

Figure 16:
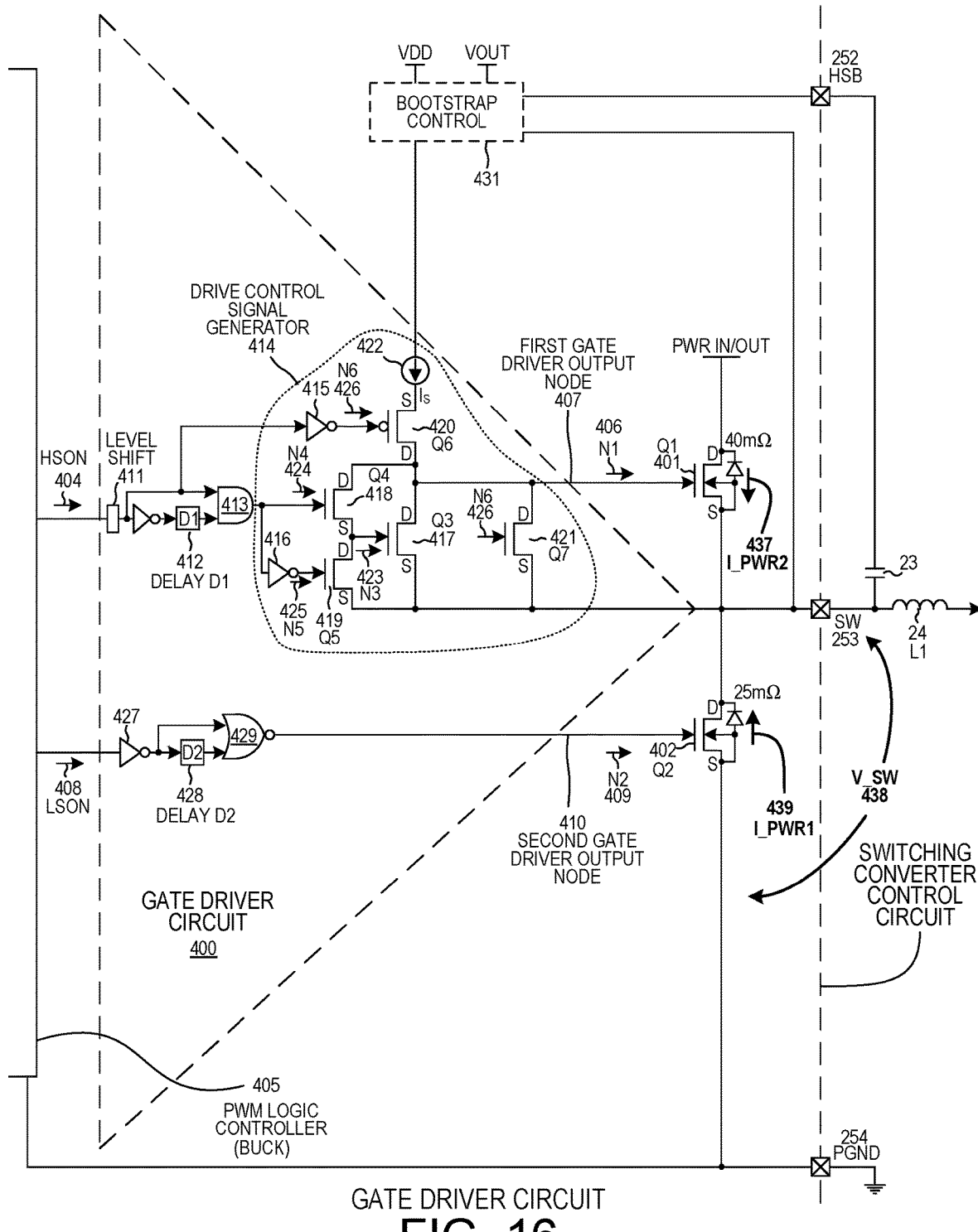
FIG. 16 is a circuit diagram of a novel gate driver circuit 400.

FIG. 16 is a circuit diagram of a novel gate driver circuit 400 shown in FIG. 11. The gate driver circuit 400 controls high side transistor Q1 401 and low side transistor Q2 402 to switch a current through inductor L1 403 without deadtime. Neither high side transistor Q1 401 nor low side transistor Q2 402 is completely off or disabled during a switching cycle. The gate driver circuit 400 receives a high side control signal HSON 404 from PWM logic controller 405 and, in turn, generates and supplies a control signal N1 406 onto a gate of high side transistor Q1 401 via a first gate driver output node 407. The gate driver circuit 400 receives a low side control signal LSON 408 and, in turn, generates and supplies a control signal N2 409 onto a gate of low side transistor Q2 402 via a second gate driver output node 410.

The gate driver circuit 400 generates the control signal N1 406 using level shift circuit 411, a time delay circuit 412, an AND gate 413, and drive control signal generator circuit 414. Drive control signal generator circuit 414 comprises inverters 415 and 416, transistor Q3 417, transistor Q4 418, transistor Q5 419, transistor Q6 420, transistor Q7 421, and current source circuit 422. A gate terminal of transistor Q3 417 is coupled between a source terminal of transistor Q4 418 and a drain terminal of transistor Q5 419. The gate terminal of transistor Q3 417 receives a control signal N3 423. A gate terminal of transistor Q4 418 is coupled to receive a control signal N4 424 output from AND gate 413. A gate terminal of transistor Q5 419 is coupled to receive a control signal N5 425 output from inverter 416. A gate terminal of transistor Q6 420 is coupled to receive a control signal N6 426 output from inverter 415. A source terminal of transistor Q6 420 is coupled to receive current $I_S$ output by current source circuit 422. A gate terminal of transistor Q7 421 is coupled to receive the control signal N6 426 output from inverter 415. A drain terminal of each of transistor Q6 420, transistor Q4 418, transistor Q3 417, and Q7 421 is coupled to the first gate driver output node 407.

The gate driver circuit 400 generates the control signal N2 409 using level shift circuit 427, a time delay circuit 428, and a NOR gate 429.

During operation of the gate driver circuit 400, the gate driver circuit 400 switches the low side transistor Q2 402 from an enabled state to a disabled state and switches the high side transistor Q1 401 from a disabled state to an enabled state without completely switching off both high side transistor Q1 401 and low side transistor Q2 402. Gate driver circuit 400 switches the current on the SW terminal without dead time. Prior to turning on the high side transistor Q1 401, control signal HSON 404 has a digital logic low level and control signal LSON 408 has a digital logic high level.

To initiate turn on of the high side transistor Q1 401, the PWM logic controller 405 asserts control signal HSON 404 and de-asserts control signal LSON 408. In response to control signal LSON 408 being de-asserted, gate driver circuit 400 controls low side transistor Q2 402 to be disabled. In response to control signal HSON 404 being asserted, In the constant current mode, high side transistor Q1 401 and transistor Q3 417 form a current mirror. The driver control signal generator 414 controls the high side transistor Q1 401 to operate in the first mode until the low side transistor Q2 is completely switched off.

In the first mode, N4 424 is asserted to a digital logic high level causing transistor Q4 418 to switch on and N5 425 is deasserted to a digital logic low level causing transistor Q5 419 to switch off. When transistor Q4 418 is enabled and transistor Q5 419 is disabled, transistor Q3 417 operates as a diode-connected N-channel transistor such that high side transistor Q1 401 and transistor Q3 417 are connected as a current mirror in which the current through transistor Q3 417 is the current $I_S$ set by current source 422. The high side transistor Q1 401 and transistor Q3 417 are connected as a current source because their gates are essentially connected together (through transistor Q4 418 which is on), their sources are tied together, and the drain and the gate of one mirror transistor are tied together. The transistor Q1 401 and transistor Q3 417 operate as a current mirror provided that $V_{DS}$ across transistor Q1 401 is greater than its saturation voltage. This happens soon after the start of a second amount of time (shortly after T1 shown in FIG. 17).

After low side transistor Q2 is completely switched off, the driver control signal generator 414 enables the high side transistor Q1 401 to operate in a second mode. In this example, the second mode is a full-enhancement mode. In the full-enhancement mode, the high side transistor Q1 401 is completely on. Transistor Q1 401 operates in the full-enhancement mode for a third amount of time (between T2 and T3 shown in FIG. 17).

Bootstrap control circuit 431 is coupled to receive VDD supply voltage, a voltage on terminal VOUT, a voltage on terminal HSB 252, and a voltage on terminal SW 253. Bootstrap control circuit 431 supplies power to gate driver circuit 400. For additional information on the structure and operation of bootstrap circuit 431, see U.S. patent application Ser. No. 15/633,662 entitled "Optimized Gate Driver For Low Voltage Power Loss Protection System," by Lam et al. filed on Jun. 26, 2017. The entire subject matter of U.S. patent application Ser. No. 15/633,662 is hereby incorporated by reference.

Figure 17:
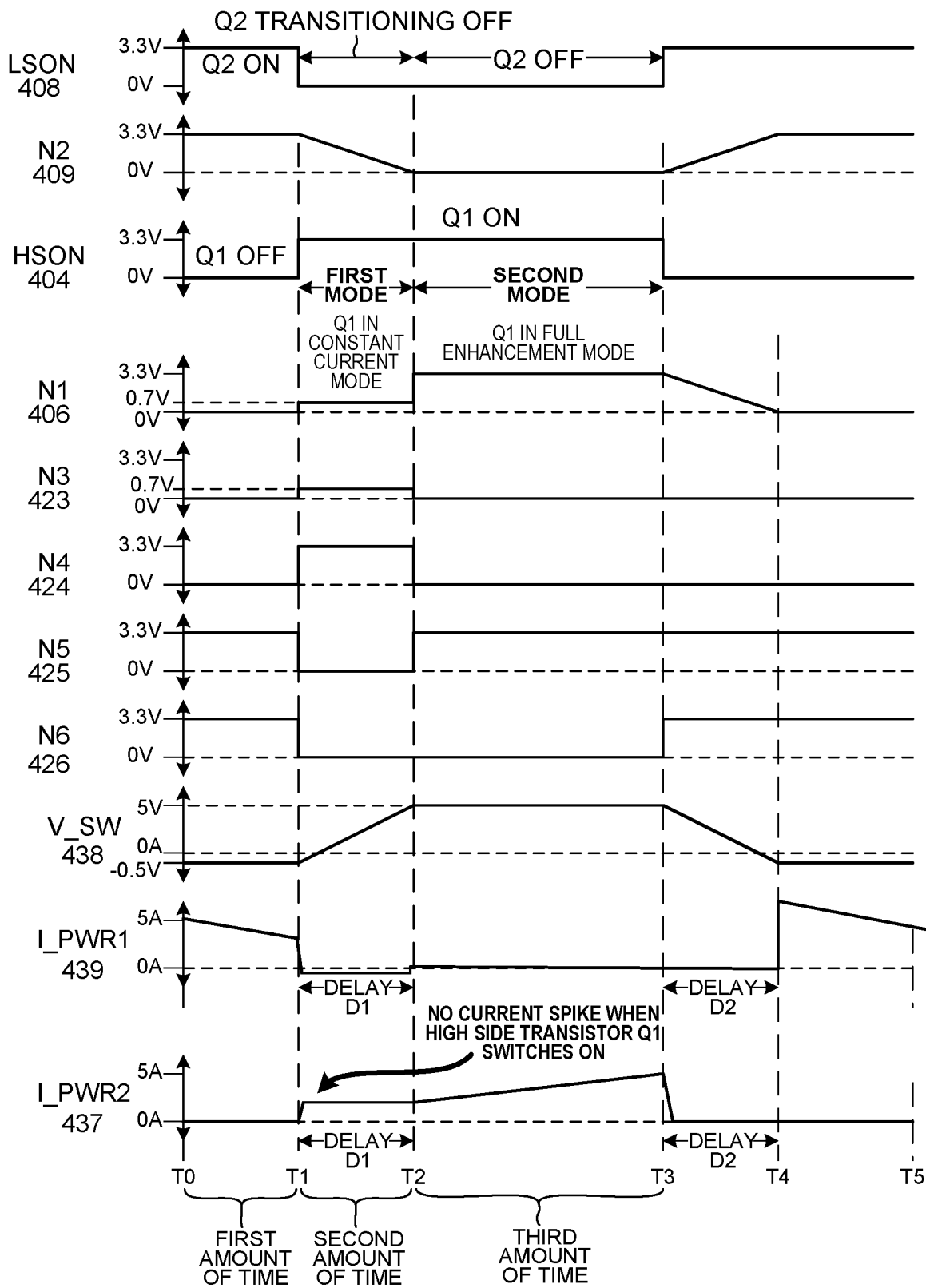
FIG. 17 is a waveform diagram along various nodes of the gate driver circuit 400 shown in FIG. 16.

FIG. 17 is a waveform diagram along various nodes of the gate driver circuit 400 shown in FIG. 16. Between time T0 and T1, the LSON 408 is asserted and HSON 404 is de-asserted. The low side transistor Q2 402 is fully on and the high side transistor Q1 401 is off and not conducting current.

At time T1, the LSON 408 is de-asserted and HSON 404 is asserted. In response to LSON 408 being de-asserted, the low side transistor Q2 402 is switched off. In response to HSON 404 being asserted, the high side transistor Q1 401 is enabled in a first mode. The first mode is a constant current mode. In the constant current mode, control signal N1 406 supplied to the gate of high side transistor Q1 401 is at approximately 0.7 volts and control signal N3 423 supplied to the gate of transistor Q3 417 is at approximately 0.7 volts. The high side transistor Q1 401 remains in the constant current mode between time T1 and T2. It is appreciated that no current spike is present at the start of the second amount of time at T1.

At time T2, the low side transistor Q2 402 is completely off and the high side transistor Q1 401 is controlled in a second mode. In this example, the second mode is a full-enhancement mode. The high side transistor Q1 401 remains in the full-enhancement mode between time T2 and T3.

AT time T3, LSON 408 is asserted and HSON 404 is de-asserted. Transistor Q7 421 is used to switch off high side transistor Q1 401. From T4 to T4, low side transistor Q2 402 is on.

Figure 18:
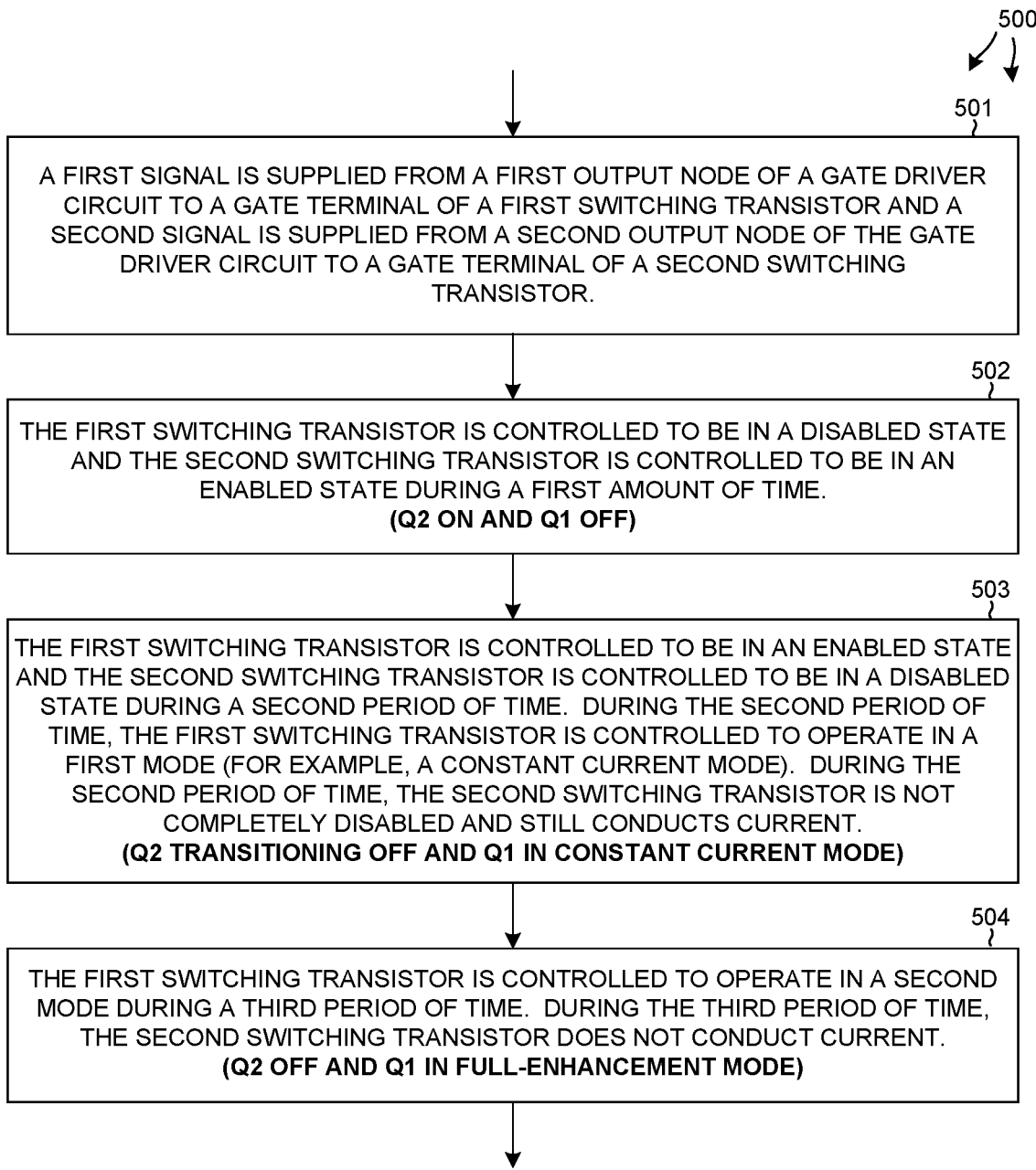
FIG. 18 is a flowchart 500 in accordance with one novel aspect.

FIG. 18 is a flowchart 500 in accordance with one novel aspect. In a first step (step 501), a first signal is supplied from a first output node of a gate driver circuit to a gate terminal of a first switching transistor and a second signal is supplied from a second output node of the gate driver circuit to a gate terminal of a second switching transistor. For example, control signal N1 406 is supplied to a gate of high side transistor Q1 401 via first output gate driver terminal 407. Control signal N2 409 is supplied to a gate of low side transistor Q2 402 via first output gate driver terminal 410.

In a second step (step 502), the first switching transistor is controlled to be in a disabled state and the second switching transistor is controlled to be in an enabled state during a first period of time. For example, between T0 and T1 in FIG. 17, high side transistor Q1 401 is off and of low side transistor Q2 402 is on.

In a third step (step 503), the first switching transistor is controlled to be in an enabled state and the second switching transistor is controlled to be in a disabled state during a second period of time. During the second period of time, the first switching transistor is controlled to operate in a first mode. During the second period of time, the second switching transistor is not completely disabled and still conducts current. For example, between T1 and T2 in FIG. 17, the high side transistor Q1 401 is controlled in a constant current mode and low side transistor Q2 402 is switched off. The low side transistor Q2 402 is not entirely off and still conducts current between T1 and T2.

In a fourth step (step 504), the first switching transistor is controlled to operate in a second mode during a third period of time. During the third period of time, the second switching transistor does not conduct current. For example, between T2 and T3 in FIG. 17, high side transistor Q1 401 is controlled in a full-enhancement mode and is completely on. The low side transistor Q2 402 is entirely off between T2 and T3 and does not conduct current.

Although certain specific embodiments are described above for instructional purposes, the teachings of this patent document have general applicability and are not limited to the specific embodiments described above. For example, although the high side transistor Q1 401 and low side transistor Q2 402 are shown as included within the power loss protection integrated circuit 206, in other embodiments the high side transistor Q1 401 and low side transistor Q2 402 are external to the power loss protection integrated circuit 206 and are not parts of the integrated circuit 206. Accordingly, various modifications, adaptations, and combinations of various features of the described embodiments can be practiced without departing from the scope of the invention as set forth in the claims.

What is claimed is:

1. An integrated circuit comprising:
a switching converter control circuit that includes a gate driver circuit, wherein the gate driver circuit has a first gate driver output node and second gate driver output node, wherein the first gate driver output node is coupled to supply a first control signal onto a first terminal of a first transistor, wherein the second gate driver output node is coupled to supply a second control signal onto a first terminal of a second transistor, wherein the gate driver circuit controls the first transistor to be disabled during a first amount of time, wherein the gate driver circuit controls the second transistor to be enabled during the first amount of time, wherein the gate driver circuit controls the second transistor to transition from an enabled state to a disabled state at a beginning of a second amount of time, wherein the gate driver circuit controls the first transistor to switch from a disabled state to an enabled state at the beginning of the second amount of time, wherein during the second amount of time the gate driver circuit controls the first transistor to operate in a first mode, wherein the gate driver circuit controls the first transistor to operate in a second mode at the beginning of a third amount of time, wherein the first transistor conducts at a current level of greater magnitude in the second mode than in the first mode, and wherein the first mode is a constant current mode.

2. The integrated circuit of claim 1, wherein the second mode is a full enhancement mode.

3. The integrated circuit of claim 1, wherein during the second amount of time the second transistor is transitioning to a non-conductive state.

4. The integrated circuit of claim 1, wherein the gate driver circuit switches from controlling the first transistor in the first mode to the second mode after the second transistor is completely off and no longer conducts current.

5. An integrated circuit comprising:
a switch terminal;
a ground terminal;
a supply terminal; and
a switching converter control circuit comprising:
   a first transistor having a first terminal, a second terminal, and a third terminal, wherein a second terminal of the first transistor is coupled to the switch terminal of the integrated circuit, and wherein a third terminal of the first transistor is coupled to the supply terminal of the integrated circuit;
   a second transistor having a first terminal, a second terminal, and a third terminal, wherein the second terminal of the second transistor is coupled to the ground terminal of the integrated circuit, and wherein the third terminal of the second transistor is coupled to the switch terminal of the integrated circuit; and
   a gate driver circuit having a first gate driver output node and second gate driver output node, wherein the first gate driver output node is coupled to supply a first control signal onto the first terminal of the first transistor, wherein the second gate driver output node is coupled to supply a second control signal onto the first terminal of the second transistor, wherein the gate driver circuit controls the first transistor to be disabled during a first amount of time, wherein the gate driver circuit controls the second transistor to be enabled during the first amount of time, wherein the gate driver circuit controls the second transistor to transition from an enabled state to a disabled state at a beginning of a second amount of time, wherein the gate driver circuit controls the first transistor to switch from a disabled state to an enabled state at the beginning of the second amount of time, wherein during the second amount of time the gate driver circuit controls the first transistor to operate in a first mode, and wherein the gate driver circuit controls the first transistor to operate in a second mode at the beginning of a third amount of time, wherein the gate driver circuit comprises a third transistor, and wherein in the first mode the first transistor and the third transistor operate as a current mirror transistor pair.

6. The integrated circuit of claim 5, wherein the first terminal of the first transistor is a gate terminal, wherein the second terminal of the first transistor is a source terminal, wherein the third terminal of the first transistor is a drain terminal, wherein the first terminal of the second transistor is a gate terminal, wherein the second terminal of the second transistor is a source terminal, wherein the third terminal of the second transistor is a drain terminal.

7. The integrated circuit of claim 5, wherein the supply terminal is coupled to a stored power source.

8. The integrated circuit of claim 5, wherein the gate driver circuit comprises:
a first input node coupled to receive a first input signal, wherein the gate driver circuit controls the first transistor to switch to operating in the first mode in response to detecting a transition of a digital logic level of the first input signal; and
a second input node coupled to receive a second input signal, wherein the gate driver circuit controls the second switching transistor to switch in response to detecting a transition of a digital logic level of the second input signal.

9. The integrated circuit of claim 5, wherein the switch terminal is coupled to a terminal of an inductor, wherein the first transistor is a high side field effect transistor, and wherein the second transistor is a low side field effect transistor.

10. The integrated circuit of claim 5, wherein the first mode is a constant current mode, and wherein the second mode is a full enhancement mode.

11. A method comprising:
(a) supplying a first signal from a first output node of a gate driver circuit to a gate terminal of a first transistor and supplying a second signal from a second output node of the gate driver circuit to a gate terminal of a second transistor, and wherein the first transistor and the second transistor are coupled to a switching terminal;
(b) during a first amount of time, the first transistor is controlled to be in a disabled state and the second transistor is controlled to be in an enabled state;
(c) during a second amount of time, the first transistor is controlled to be in an enabled state and the second transistor is controlled to be in a disabled state, wherein during the second amount of time the first transistor is controlled to operate in a first mode, wherein during the second amount of time the second transistor is switching off, and wherein a voltage on the switching terminal changes linearly throughout the second amount of time; and (d) during a third amount of time, the first transistor is controlled to operate in a second mode, and wherein during the third amount of time the second transistor is disabled.

12. The method of claim 11, wherein in the first mode the first transistor operates in constant current mode.

13. The method of claim 11, wherein in the second mode the first transistor operates in full enhancement mode.

14. The method of claim 11, wherein the first transistor switches from operating in the first mode to operating in the second mode after the second transistor is off and does not conduct current.

15. The method of claim 11, wherein the first transistor is a high side field effect transistor, and wherein the second transistor is a low side field effect transistor.

16. An integrated circuit comprising:
a pair of transistors, wherein the pair of transistors comprises a first transistor and a second transistor, wherein the first transistor has a terminal coupled to a switch terminal, and wherein the second transistor has a terminal coupled to the switch terminal; and
means for switching a current on the switch terminal without completely turning off both transistors of the pair of transistors, wherein the means is also for disabling the first transistor during a first amount of time, for transitioning the second transistor from an enabled state to a disabled state at a beginning of a second amount of time, for transitioning the first transistor from a disabled state to an enabled state at the beginning of the second amount of time, for controlling the first transistor to operate in a first mode during the second amount of time, and for controlling the first transistor to operate in a second mode at the beginning of a third amount of time, wherein the first transistor conducts current at a current level of greater magnitude in the second mode than in the first mode, and wherein the first mode is a constant current mode.

17. The integrated circuit of claim 16, wherein the means is a gate driver circuit having a first gate driver output node and second gate driver output node, wherein the first gate driver output node is coupled to a gate terminal of the first transistor of the pair of transistors, and wherein the second gate driver output node is coupled to a gate terminal of the second transistor of the pair of transistors.

18. The integrated circuit of claim 16, wherein the first transistor of the pair of transistors is a high side field effect transistor, and wherein the second transistor of the pair of transistors is a low side field effect transistor.

19. The integrated circuit of claim 16, wherein the second mode is a full enhancement mode.

* * * * *

UNITED STATES PATENT AND TRADEMARK OFFICE
CERTIFICATE OF CORRECTION

| | | |
|---|---|---|
| PATENT NO. | : 10,826,480 B1 | Page 1 of 1 |
| APPLICATION NO. | : 15/640505 | |
| DATED | : November 3, 2020 | |
| INVENTOR(S) | : Thinh Ba Nguyen et al. | |

It is certified that error appears in the above-identified patent and that said Letters Patent is hereby corrected as shown below:

In the Specification

At Column 5, Line 50, replace "$A_{HS}$" with --$A_{HC}$--.

Signed and Sealed this
Twenty-sixth Day of January, 2021

Drew Hirshfeld
*Performing the Functions and Duties of the*
*Under Secretary of Commerce for Intellectual Property and*
*Director of the United States Patent and Trademark Office*